US009620331B1

(12) United States Patent
Bhattiprolu et al.

(10) Patent No.: US 9,620,331 B1
(45) Date of Patent: Apr. 11, 2017

(54) METHOD FOR ANALYZING AN OBJECT AND CHARGED PARTICLE BEAM DEVICE FOR CARRYING OUT THE METHOD

(71) Applicants: Carl Zeiss Microscopy Ltd., Cambridge (GB); Carl Zeiss X-ray Microscopy, Inc., Pleasanton, CA (US)

(72) Inventors: Sreenivas Bhattiprolu, Dublin, CA (US); Edward Hill, Huntingdon (GB)

(73) Assignees: Carl Zeiss Microscopy Ltd., Cambridge (GB); Carl Zeiss X-ray Microscopy, Inc., Pleasanton, CA (US)

( * ) Notice: Subject to any disclaimer, the term of this patent is extended or adjusted under 35 U.S.C. 154(b) by 0 days.

(21) Appl. No.: 14/945,902

(22) Filed: Nov. 19, 2015

(51) Int. Cl.
*H01J 37/00* (2006.01)
*H01J 37/26* (2006.01)

(52) U.S. Cl.
CPC .................................. *H01J 37/261* (2013.01)

(58) Field of Classification Search
CPC .................................................... H01J 37/261
USPC ................. 250/306, 307; 378/82, 83, 86, 88
See application file for complete search history.

(56) References Cited

U.S. PATENT DOCUMENTS

2004/0036031 A1    2/2004  Rose et al.
2016/0061754 A1*   3/2016  Hill .................... G01N 23/2252
                                                                  250/310

FOREIGN PATENT DOCUMENTS

WO     WO 02/067286 A2     8/2002

OTHER PUBLICATIONS

Carmi et al., "Resolution enhancement in MRI", *Magnetic Resonance Imaging* 24 (2006), 133-154.

* cited by examiner

*Primary Examiner* — Michael Maskell
(74) *Attorney, Agent, or Firm* — Muirhead and Saturnelli, LLC

(57) ABSTRACT

The system described herein relates to analyzing an object using a charged particle beam device generating a beam of charged particles and to the charged particle beam device for analyzing the object. A part of an image of the object corresponding to a volume unit surface of a volume unit is segmented into an area having a first color level and a second color level as well corresponding area fractions are determined. A plurality of particles with color levels are identified by comparing the color levels with the information stored in a database. By comparing the color levels, it is possible to identify the potential particles, for example minerals, which may be included in the volume unit.

30 Claims, 11 Drawing Sheets

METHOD FOR ANALYZING AN OBJECT AND CHARGED PARTICLE BEAM DEVICE FOR CARRYING OUT THE METHOD

TECHNICAL FIELD

The system described herein relates to analyzing an object using a charged particle beam device generating a beam of charged particles.

BACKGROUND OF THE INVENTION

Charged particle beam devices are used for analyzing and examining objects (hereinafter also called samples) in order to obtain insights with regard to the properties and behavior of the objects under specific conditions. One of those charged particle beam devices is an electron beam device, in particular a scanning electron microscope (also known as SEM).

In an SEM, an electron beam (hereinafter also called primary electron beam) is generated using a beam generator. The electrons of the primary electron beam are accelerated to a predeterminable energy and focused by a beam guiding system, in particular an objective lens, onto a sample to be analyzed (that is to say an object to be analyzed). A high-voltage source having a predeterminable acceleration voltage is used for acceleration purposes. Using a deflection unit, the primary electron beam is guided in a raster-type fashion over a surface of the sample to be analyzed. In this case, the electrons of the primary electron beam interact with the material of the sample to be analyzed. In particular, interaction particles and/or interaction radiation arise(s) as a consequence of the interaction. By way of example, electrons are emitted by the sample to be analyzed (so-called secondary electrons) and electrons of the primary electron beam are backscattered at the sample to be analyzed (so-called backscattered electrons). The secondary electrons and backscattered electrons are detected and used for image generation. An image of the sample to be analyzed is thus obtained.

The interaction radiation comprises X-rays and/or cathodoluminescence light and may be detected with a radiation detector. When measuring X-rays with the radiation detector, in particular energy-dispersive X-ray spectroscopy (also known as EDS or EDX) may be carried out. EDX is an analytical analysis method used for the elemental analysis or chemical characterization.

An ion beam device is also known from the prior art. The ion beam device comprises an ion beam column having an ion beam generator. Ions are generated which are used for processing a sample (for example for removing a layer of the sample or for depositing material on the sample, wherein the material is provided by a gas injection system) or else for imaging.

Furthermore, it is known from the prior art to use combination devices for processing and/or for analyzing a sample, wherein both electrons and ions can be guided onto a sample to be processed and/or to be analyzed. By way of example, it is known for an SEM to be additionally equipped with an ion beam column as mentioned above. The SEM serves, in particular, for observing the processing, but also for further analysis of the processed or non-processed sample. Electrons may also be used for depositing material. This is known as electron beam induced deposition (EBID).

EDX is often used as analytical analysis method for analyzing rocks in the field of mineralogy. It is possible to identify the composition of a mineral grain which is important information, in particular for a petrologist who needs to accurately determine the mineralogy of a rock. EDX often requires irradiating a sample with electrons of an SEM having a landing energy of at least 15 keV. The landing energy is the energy which the electrons have when impinging onto the sample. Electrons having such an energy penetrate rather deep into a sample and generate X-rays from a volume unit of the sample comprising an extension of approximately 2 µm in a first direction, in a second direction and in a third direction. Therefore, the volume unit comprises dimensions of approximately 2 µm×2 µm×2 µm. Accordingly, the volume unit also comprises a volume unit surface of 2 µm×2 µm. The volume unit surface is also called an EDX pixel.

Most mudrocks to be analyzed comprise mineral grains which are smaller than 2 µm. Therefore, they are smaller than the EDX pixel. Accordingly, an EDX spectrum which is generated based on X-rays emitted from the volume unit may comprise not only information about a single mineral grain of interest, but also about further surrounding mineral grains located in the volume unit. Therefore, the information provided by the EDX spectrum may be impossible to understand or may lead to a false result.

It is desirable to provide a method for analyzing an object using a charged particle beam device and a charged particle beam device for carrying out the method which make it possible that a petrologist may accurately determine the mineralogy of a rock.

SUMMARY OF THE INVENTION

A method according to the system described herein is used for analyzing an object using a charged particle beam device, for example an electron beam device and/or an ion beam device. The charged particle beam device may comprise a charged particle generator for generating a charged particle beam having charged particles and an objective lens for focusing the charged particle beam onto the object. The charged particles may be electrons and/or ions. Moreover, the charged particle beam device may comprise a first detection unit for detecting interaction particles and a second detection unit for detecting interaction radiation, the interaction particles and the interaction radiation being generated when the charged particle beam impinges on the object. The interaction particles may be secondary particles, for example secondary electrons, or backscattered particles, for example backscattered electrons. The interaction radiation may be X-rays or cathodoluminescence light. Moreover, the charged particle beam device may comprise a database storing information about characteristics of a first particle and of a second particle. The first particle and/or the second particle may be minerals. The database comprises characteristics of such minerals, in particular their chemical composition. The database may comprise characteristics of more than the above mentioned two particles. In a preferred embodiment the database may comprise characteristics of several minerals from real life samples from different regions globally.

The method according to the system described herein comprises the step of guiding the charged particle beam over the object and detecting interaction particles using the first detection unit. A first detection signal is generated using the first detection unit and an image of the object is generated using the first detection signal. The image comprises regions of different color levels, for example different gray levels. Moreover, the image has an image resolution which may be smaller than 100 nm.

The method also comprises the step of detecting interaction radiation using the second detection unit. As mentioned above, the interaction radiation may be X-rays or cathodoluminescence light. A second detection signal is generated using the second detection unit, and a radiation spectrum is generated using the second detection signal. The radiation spectrum comprises, for example, the signal intensity dependent on the energy of the X-rays. The radiation spectrum may be used for EDX.

The radiation spectrum represents a volume unit of the object and provides information about the overall material composition of the volume unit. The volume unit has a first extension along a first axis, a second extension along a second axis and a third extension along a third axis. The first axis, the second axis and the third axis may be arranged perpendicular to each other. The first extension, the second extension and/or the third extension may be 2 μm. However, the first extension, the second extension and/or the third extension are not restricted to this value. Instead, any suitable value may be chosen. Moreover, the volume unit has a volume unit surface being spanned by two of: the first axis, the second axis and the third axis.

The image resolution is less than at least one of: the first extension, the second extension and the third extension. According to one embodiment of the system described herein, the image resolution is 100 nm whereas the first extension, the second extension and/or the third extension is/are 2 μm.

The method according to the system described herein also comprises the step of segmenting a part of the image corresponding to the volume unit surface in an area having a first color level and second color level. In other words, in the area of the volume unit and the volume unit surface, respectively, the image generated using the interaction particles and having a high resolution is segmented in such a way that a first segment comprises the area having the first color level and a second segment comprises the area having the second color level. The first color level and/or the second color level may be a gray level.

The method according to the system described herein also comprises the step of determining a first area fraction of the area of the volume unit surface comprising the first color level and determining a second area fraction of the area of the volume unit surface comprising the second color level. For example, the first area fraction of the area comprising the first color level is 70% of the area of the volume unit surface, and the second area fraction of the area comprising the second color level is 30% of the area of the volume unit surface.

The method according to the system described herein also comprises the step of identifying the first particle associated with the first color level by comparing the first color level with the information stored in the database, and identifying the second particle associated with the second color level by comparing the second color level with the information stored in the database. In other words, the database is a look up table comprising information about the first particle and the second particle. The information also comprises the first color level which the first particle usually has in an image generated using interaction particles. Moreover, the information also comprises the second color level which the second particle usually has in an image generated using interaction particles. Therefore, by comparing the color levels, it is possible to identify the potential particles (for example minerals) which may be included in the volume unit.

The method according to the system described herein also comprises the step of determining a composition of the volume unit by using the information about the identified first particle (i.e. the characteristics of the identified first particle), the first area fraction, the information about the second particle (i.e. the characteristics of the identified second particle) and the second area fraction, wherein the composition of the volume unit is proportionally composed of the first particle in a quantity of the first area fraction and of the second particle in a quantity of the second area fraction. In other words, the proportion of the first particle in the composition of the volume unit is equal to the proportion of the first area fraction in the entire area of the volume unit surface. Moreover, the proportion of the second particle in the composition of the volume unit is equal to the proportion of the second area fraction in the entire area of the volume unit surface.

The method according to the system described herein makes it possible that a petrologist may accurately determine the mineralogy of a rock. It combines the high resolution of an image provided by a charged particle beam device with information provided by radiation analysis, for example EDX.

It is additionally or alternatively provided in an embodiment of the system described herein that at least one of: the first color level and the second color level is a gray level, as already mentioned above.

Moreover, it is additionally or alternatively provided in an embodiment of the system described herein that at least one of: the first particle and the second particle is a mineral.

Furthermore, it is additionally or alternatively provided in an embodiment of the system described herein that three color levels, in particular three gray levels are determined in the part of the image of the volume unit surface during the step of segmenting. In particular, the database also stores information about characteristics of a third particle. The area also comprises a third color level. The method further comprises the step of determining a third area fraction of the area comprising the third color level and identifying the third particle associated with the third color level by comparing the third color level with the information stored in the database. Furthermore, the composition of the volume unit is determined also by using the information about the third particle and the third area fraction, wherein the composition of the volume unit is also proportionally composed of the third particle in a quantity of the third area fraction. In other words, the proportion of the third particle in the composition of the volume unit is equal to the proportion of the third area fraction in the entire area of the volume unit surface.

It is additionally or alternatively provided in an embodiment of the system described herein that the area of the part of the image corresponding to the volume unit surface comprises the first color level, the second color level and the third color level only. Therefore, up to three color levels are considered only in this embodiment. However, the invention is not restricted to the use of up to three color levels. Instead, any suitable number of color levels may be chosen, for example 5 to 20 color levels.

It is additionally or alternatively provided in an embodiment of the system described herein that the database comprises information about characteristics of a plurality of particles, namely about characteristics of a plurality of first particles and about characteristics of a plurality of second particles. Furthermore, the step of identifying the first particle may comprise identifying a part or all of the plurality of first particles associated with the first color level. In other words, by comparing the first color level with the information stored in the database, all or a part of the plurality of first particles are identified which are/is associated with the first color level. This embodiment of the system described herein is based on the following thought. As mentioned above, the database may comprise characteristics of several minerals, in particular their chemical composition. However, since several minerals only slightly differ from each other, it might be that they have the same color level (for example a gray level) in an image being generated using interaction particles. Therefore, the database may comprise the identical color level for different particles in the form of minerals. If the color level obtained in the image of the object is associated with several particles in the form of minerals, the database will provide all minerals associated with this obtained color level. Therefore, it is desirable to identify the first particle out of those several possible first particles which is actually included in the volume unit. The embodiment of the system described herein identifies this first particle by comparing the characteristics of each of the first particles of the part or of all of the plurality of first particles with the information about the overall material composition of the volume unit. The first particle whose characteristics come closest to the information about the overall material composition of the volume unit is selected. In other words, a single first particle out of the part or all of the plurality of first particles is determined in such a way that the characteristics of the single first particle come closest to the information about the overall material composition of the volume unit with respect to all of the plurality of first particles. Therefore, a single first particle is picked out of the part or all of the plurality of first particles. The characteristics of this single first particle come closest to the overall material composition of the volume unit provided by the radiation spectrum than any other characteristics of the further first particles of the plurality of first particles. The step of determining the composition of the volume unit now comprises using the single first particle.

Alternatively or additionally, the step of identifying the second particle may comprise identifying a part or all of the plurality of second particles associated with the second color level. In other words, by comparing the second color level with the information stored in the database, all or a part of the plurality of second particles are identified which are/is associated with the second color level. This embodiment of the system described herein is based on the identical thought as mentioned above. The database may comprise the identical color level for different particles in the form of minerals. If the color level obtained in the image of the object is associated with several particles in the form of minerals, the database will provide all minerals associated with this obtained color level. Therefore, it is desirable to identify also the second particle out of those several possible second particles which is actually included in the volume unit. The embodiment of the system described herein identifies this second particle by comparing the characteristics of each of the second particles of the part or of all of the plurality of second particles with the information about the overall material composition of the volume unit. The second particle whose characteristics come closest to the information about the overall material composition of the volume unit is selected. In other words, a single second particle out of the part or all of the plurality of second particles is determined in such way that the characteristics of the single second particle come closest to the information about the overall material composition of the volume unit with respect to all of the plurality of second particles. Therefore, a single second particle is picked out of the part or all of the plurality of second particles. The characteristics of this single second particle come closest to the overall material composition of the volume unit provided by the radiation spectrum than any other characteristics of the further second particles of the plurality of second particles. The step of determining the composition of the volume unit now comprises using the single second particle.

It is additionally or alternatively provided in an embodiment of the system described herein that the step of segmenting the part of the image corresponding to the volume unit surface comprises using a gray level histogram. The gray level histogram of the image is a histogram of pixel intensity values of pixels in an image, i.e. the image generated using the interaction particles. The histogram comprises the counts of pixel having a specific gray level intensity. Usually, the histogram shows high distribution of pixels in the form of peaks. If two peaks are shown in the histogram, those two peaks are identified as the first color level and the second color level. If more than two peaks are identified, only the most intense two peaks (two colors) or three peaks (three colors) are chosen.

It is additionally or alternatively provided in a further embodiment of the system described herein that the first particle is identified by using the radiation spectrum only if the first particle is larger than the volume unit surface. Therefore, the first particle is a large grain such that the above mentioned problem of a volume unit comprising more than two particles does not occur. The radiation spectrum is generated by guiding the charged particle beam to the center of the first particle (i.e. the large grain). The same applies to the second particle if the second particle is larger than the volume unit surface.

Moreover, it is additionally or alternatively provided in an embodiment of the system described herein that, if the volume unit comprises organic material, the organic material is assigned a given chemical composition, for example a given chemical composition of 95 weight % carbon (C) and 5 weight % oxygen (O). Such a composition of organic material is rather common and accurate.

It is additionally or alternatively provided in an embodiment of the system described herein that the first detection unit and/or the second detection unit are calibrated using a calibration object. This embodiment is based on the following idea. The database stores information about characteristics of the minerals. The database is a lookup table comprising this information. In particular, the database comprises characteristics of minerals from real-life samples from different regions globally. The information about the particles/minerals is obtained once and stored in the database. In particular, the information comprises the color level which each mineral usually has in an image generated using interaction particles in a charged particle beam device. This color level may be determined by initially analyzing such minerals in the charged particle beam device, generating an image using the interaction particles such as secondary electrons and/or backscattered electrons. However, the color level is dependent on the mode of operation of the charged particle beam device. The mode of operation is influenced in particular by the landing energy of the charged particles on the object, by the detector efficiency and by the amplification of the detection signal. Accordingly, each analysis of an object with an unknown composition may be carried out using the identical mode of operation. This is provided by calibrating the first detection unit and/or the second detection unit using the calibration object. Moreover, the identical landing energy may be used. The calibration of the first detection unit and/or the second detection unit may be carried out twice, a first time with the charged particle beam device used for collecting information for the database and a second time with the charged particle beam device used for carrying out the method according to the system described herein. Those two charged particle beam devices may be different.

A further method according to the system described herein is used also for analyzing an object. The further method also uses a charged particle beam device, for example an electron beam device and/or an ion beam device. The charged particle beam device may comprise a charged particle generator for generating a charged particle beam having charged particles and an objective lens for focusing the charged particle beam onto the object. The charged particles may be electrons and/or ions. Moreover, the charged particle beam device may comprise a first detection unit for detecting interaction particles and a second detection unit for detecting interaction radiation, the interaction particles and the interaction radiation being generated when the charged particle beam impinges on the object. The interaction particles may be secondary particles, for example secondary electrons, or backscattered particles, for example backscattered electrons. The interaction radiation may be X-rays or cathodoluminescence light. Moreover, the charged particle beam device may comprise a database storing information about characteristics of a plurality of particles. The particles may be minerals. The database comprises characteristics of such minerals, in particular their chemical composition. In a preferred embodiment the database may comprise characteristics of several minerals from real life samples from different regions globally.

The further method according to the system described herein comprises the step of guiding the charged particle beam over the object and detecting interaction particles using the first detection unit. A first detection signal is generated using the first detection unit and an image of the object is generated using the first detection signal. The image comprises regions of different color levels, for example different gray levels. Moreover, the image has an image resolution which may be smaller than 100 nm.

The further method also comprises the step of detecting interaction radiation using the second detection unit. As mentioned above, the interaction radiation may be X-rays or cathodoluminescence light. A second detection signal is generated using the second detection unit, and a radiation spectrum is generated using the second detection signal. The radiation spectrum comprises, for example, the signal intensity dependent on the energy of the X-rays. The radiation spectrum may be used for EDX.

The radiation spectrum represents a volume unit of the object and provides information about the overall composition of the volume unit. The volume unit has a first extension along a first axis, a second extension along a second axis and a third extension along a third axis. The first axis, the second axis and the third axis may be arranged perpendicular to each other. The first extension, the second extension and/or the third extension may be 2 µm. However, the first extension, the second extension and/or the third extension are not restricted to this value. Instead, any suitable value may be chosen. Moreover, the volume unit has a volume unit surface being spanned by two of: the first axis, the second axis and the third axis.

The image resolution is less than at least one of: the first extension, the second extension and the third extension. According to one embodiment of the system described herein, the image resolution is 100 nm whereas the first extension, the second extension and/or the third extension is/are 2 µm. The image resolution may also be less than 100 nm, in particular 50 nm or less, 10 nm or less or 5 nm or less.

The further method according to the system described herein also comprises the step of segmenting a part of the image corresponding to the volume unit surface in an area having a first color level and second color level. In other words, in the area of the volume unit and the volume unit surface, respectively, the image generated using the interaction particles and having a high resolution is segmented in such a way that a first segment comprises the area having the first color level and a second segment comprises the area having the second color level. The first color level and/or the second color level may be a gray level.

The further method according to the system described herein also comprises the step of determining a first area fraction of the area comprising the first color level and determining a second area fraction of the area comprising the second color level. For example, the first area fraction of the area comprising the first color level is 70% of the area of the volume unit surface, and the second area fraction of the area comprising the second color level is 30% of the area of the volume unit surface.

The further method according to the system described herein also comprises the step of identifying a first part of the plurality of particles, the first part being associated with the first color level, by comparing the first color level with the information stored in the database, and identifying a second part of the plurality of particles, the second part being associated with the second color level, by comparing the second color level with the information stored in the database. In other words, the database is a look up table comprising information about the particles. The information also comprises the color levels which the particles usually have in an image generated using interaction particles. Therefore, by comparing the color levels, it is possible to identify the potential particles (for example minerals) which may be included in the volume unit. The potential particles having the first color level are assigned to the first part of the plurality of particles. The potential particles having the second color level are assigned to the second part of the plurality of particles.

The further method according to the system described herein also comprises the step of determining possible compositions of the volume unit for each possible combination of each single particle of the first part of the plurality of particles with each single particle of the second part of the plurality of particles by using characteristics of the single particle of the first part of the plurality of particles, the first area fraction, characteristics of the single particle of the second part of the plurality of particles and the second area fraction, wherein the composition of the volume unit is proportionally composed of the single particle of the first part of the plurality of particles in a quantity of the first area fraction and of the single particle of the second part of the plurality of particles in a quantity of the second area fraction.

The further method according to the system described herein also comprises the step of comparing each possible composition with the overall material composition of the volume unit provided by the radiation spectrum, and the step of determining the actual composition of the volume unit by choosing the composition out of the possible compositions which comes closest to the overall material composition of the volume unit provided by the radiation spectrum.

The further method according to the system described herein has the same advantage as above mentioned with respect to the other method according to the system described herein.

It is additionally or alternatively provided in an embodiment of the further method according to the system described herein that at least one of: the first color level and the second color level is a gray level, as already mentioned above. Moreover, it is additionally or alternatively provided in an embodiment of the further method according to the system described herein that the particles are minerals.

Furthermore, it is additionally or alternatively provided in an embodiment of the further method according to the system described herein that three color levels, in particular three gray levels are determined in the part of the image corresponding to the volume unit surface during the step of segmenting. In particular, the database also stores information about characteristics of a third particle. The area of the part of the image corresponding to the volume unit surface also comprises a third color level. The method further comprises the step of determining a third area fraction of the area comprising the third color level. Furthermore, the embodiment comprises the step of identifying a third part of the plurality of particles, the third part being associated with the third color level, by comparing the third color level with the information stored in the database. The step of determining possible compositions of the volume unit also considers each possible combination with each single particle of the third part of the plurality of particles by using characteristics of the single particle of the third part of the plurality of particles and the third area fraction.

It is additionally or alternatively provided in an embodiment of the further method according to the system described herein that the area of the part of the image corresponding to the volume unit surface comprises the first color level, the second color level and the third color level only. Therefore, up to three color levels are considered only. However, the invention is not restricted to this embodiment. Instead, any suitable number of color levels may be chosen, for example 4 to 20.

It is additionally or alternatively provided in an embodiment of the further method according to the system described herein that the step of segmenting the part of the image corresponding to the volume unit surface comprises using a gray level histogram, as already above mentioned.

It is additionally or alternatively provided in a further embodiment of the further method according to the system described herein that a particle is identified by using the radiation spectrum only if the volume unit comprises this particle only and if the particle is larger than the volume unit. Therefore, the particle is a large grain such that the above mentioned problem of a volume unit comprising more than two particles does not occur. The radiation spectrum is generated by guiding the charged particle beam to the center of the first particle (i.e. the large grain).

Moreover, it is additionally or alternatively provided in an embodiment of the further method according to the system described herein that, if the volume unit comprises organic material, the organic material is assigned a given chemical composition, for example a given chemical composition of 95 weight % carbon (C) and 5 weight % oxygen (O). Such a composition of organic material is rather common and accurate.

It is additionally or alternatively provided in an embodiment of the further method according to system described herein that the first detection unit and/or the second detection unit are calibrated using a calibration object. This embodiment is based on the idea as already mentioned above.

The system described herein also refers to a computer program product comprising a program code which may be loaded or is loaded into a processor and which, when being executed, controls a charged particle beam device in such a way that a method comprising at least one of the above mentioned or further below mentioned steps or a combination of at least two of the above mentioned or further below mentioned steps is carried out.

The system described herein also refers to a charged particle beam device for analyzing an object. The charged particle beam device comprises at least one charged particle generator for generating a charged particle beam comprising charged particles. The charged particles may be electrons and/or ions. The charged particle beam device also has at least one objective lens for focusing the charged particle beam onto the object. Moreover, the charged particle beam device comprises at least one first detection unit for detecting interaction particles and at least one second detection unit for detecting interaction radiation, the interaction particles and the interaction radiation being generated when the charged particle beam impinges on the object. The interaction particles may be secondary particles and/or backscattered particles, in particular secondary electrons and back-scattered electrons. The interaction radiation may be X-rays and/or cathodoluminescence light. Moreover, the charged particle beam device comprises a database storing information about characteristics of particles, for example a first particle and a second particle. As mentioned above, the particles may be minerals. The database comprises characteristics of such minerals, in particular their chemical composition. The database may comprise characteristics of more than the above mentioned two particles. In a preferred embodiment the database comprises characteristics of several minerals from real life samples from different regions globally. Moreover, the charged particle beam device comprises at least one processor into which a computer program product as above mentioned is loaded.

In an embodiment of the charged particle beam device according to the system described herein it is additionally or alternatively provided that a first detector comprises the first detector unit, and a second detector comprises the second detector unit. Therefore, the two detector units are arranged in different detectors. In an alternative embodiment a single detector comprises the first detector unit and the second detector unit.

In an embodiment of the charged particle beam device according to the system described herein it is additionally or alternatively provided that the charged particle generator is a first charged particle generator for generating a first charged particle beam comprising first charged particles. The objective lens is a first objective lens for focusing the first charged particle beam onto the object. The charged particle beam device further comprises a second charged particle generator for generating a second charged particle beam comprising second charged particles and a second objective lens for focusing the second charged particle beam onto the object.

In an embodiment of the charged particle beam device according to the system described herein it is additionally or alternatively provided that the charged particle beam device is at least one of the following: an electron beam device or an ion beam device. In particular, the charged particle beam device may be both an electron beam device and an ion beam device.

The system described herein also refers to a further method which solves the above mentioned problem of the prior art. The further method is based on the fact that high resolutions are desirable for most digital imaging applications. One possible solution to increase the spatial resolution is to reduce the size of the pixel in an image. However, this is not a viable solution for applications where the resolution is dictated by an object having an interaction volume such as the object discussed further above. Therefore, the system described herein is also based on the idea to use a signal processing technique to reconstruct high resolution images from an original low resolution image. This is carried out by oversampled images to reconstruct higher resolution images which is disclosed in Carmi et al, "Resolution enhancement in MRI", Magnetic Resonance Imaging 24 (2006) 133-154.

BRIEF DESCRIPTION OF THE DRAWINGS

Embodiments of the system described herein will be explained in more detail in the following text with reference to the figures, in which.

DETAILED DESCRIPTION OF VARIOUS EMBODIMENTS

Figure 1:
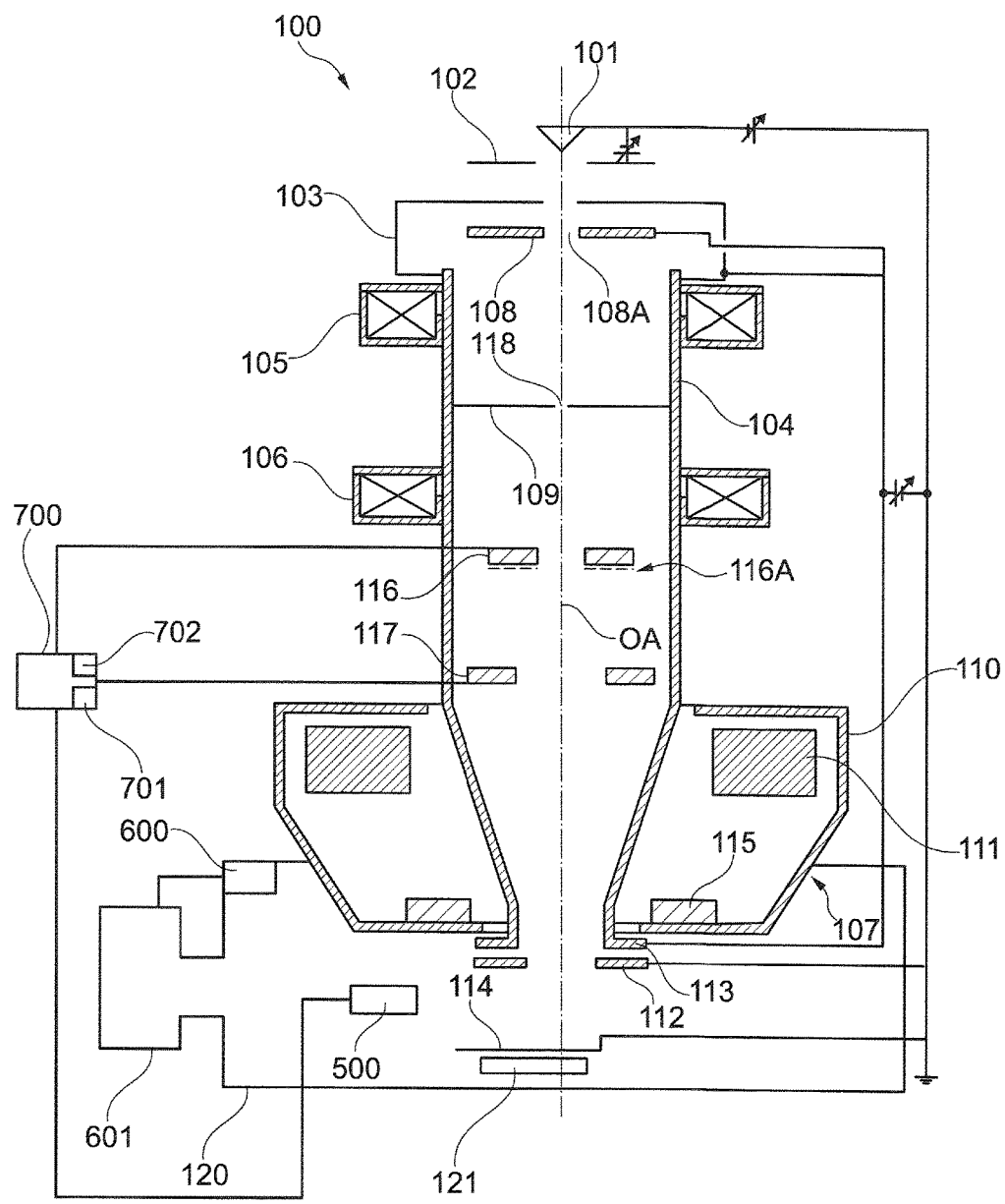
FIG. 1 shows a schematic representation of a first embodiment of a charged particle beam device.

FIG. 1 shows a schematic representation of an SEM 100. The SEM 100 has a beam generator in the form of an electron source 101 being a cathode, an extraction electrode 102, and an anode 103 which is arranged on the end of a beam guide tube 104 of the SEM 100. The electron source 101 is, for example, a thermal field emitter. However, the invention is not limited to such an electron source. Instead, any electron source may be used.

Electrons emerging from the electron source 101 form a primary electron beam. The electrons are accelerated to an anode potential due to a potential difference between the electron source 101 and the anode 103. The anode potential in this exemplary embodiment is between 0.2 kV and 30 kV relative to the ground potential of an object chamber 120, for example, 5 kV to 15 kV, in particular 8 kV, but alternatively, it could also be at ground potential.

Two condenser lenses are arranged at the beam guide tube 104, i.e., a first condenser lens 105 and a second condenser lens 106, the first condenser lens 105 being situated first, and then the second condenser lens 106, as viewed from the electron source 101 toward an objective lens 107. However, the invention is not limited to the use of two condenser lenses. Instead, further embodiments may comprise only a single condenser lens.

A first aperture unit 108 is arranged between the anode 103 and the first condenser lens 105. The first aperture unit 108 is, together with the anode 103 and the beam guide tube 104, at high-voltage potential, i.e. the potential of the anode 103, or at ground. The first aperture unit 108 may have several first aperture openings 108A. One of those first aperture openings 108A is shown in FIG. 1. For example, the first aperture unit 108 has two first aperture openings 108A. Each of the several first aperture openings 108A may have a different opening diameter. A chosen first aperture opening 108A may be arranged at an optical axis OA of the SEM 100 using an adaption mechanism. However, the invention is not limited to this embodiment. Instead, in an alternative embodiment, the first aperture unit 108 may have a single first aperture opening 108A only. No adaption mechanism is used for this alternative embodiment. The first aperture unit 108 of this alternative embodiment is fixedly arranged around the optical axis OA.

A stationary second aperture unit 109 is arranged between the first condenser lens 105 and the second condenser lens 106. Alternatively, the second aperture unit 109 is moveable.

The objective lens 107 has pole pieces 110, in which a bore has been made. The beam guide tube 104 is arranged and guided through this bore. Further, a coil 111 is arranged in the pole pieces 110.

An electrostatic deceleration device is situated downstream from the beam guide tube 104. It has a single electrode 112 and a tube electrode 113 arranged at the end of the beam guide tube 104 facing an object 114. Consequently, the tube electrode 113 is, together with the beam guide tube 104, at the potential of the anode 103, while the single electrode 112 and the object 114 are at a lower potential than that of the anode 103. In this case, this is the ground potential of the object chamber 120. Thus, the electrons of the primary electron beam may be decelerated to the desired energy required for analyzing the object 114.

In addition, the SEM 100 has a scanning device 115, via which the primary electron beam may be deflected and scanned across the object 114. In this process, the electrons of the primary electron beam interact with the object 114. As a consequence of this interaction, interaction particles and/or interaction radiation will result, which are detected. The detection signals obtained in this manner are evaluated.

As interaction particles, in particular electrons are emitted from the surface of the object 114 (so-called secondary electrons) or electrons of the primary electron beam are scattered back (so-called backscattered electrons). For detecting secondary electrons and/or backscattered electrons, a detector system which has a first detector 116 and a second detector 117 is arranged in the beam guide tube 104. The first detector 116 is arranged on the source-side along the optical axis OA, while the second detector 117 is arranged on the object-side along the optical axis OA in the beam guide tube 104. In addition, the first detector 116 and the second detector 117 are arranged offset against each other toward the optical axis OA of the SEM 100. Both the first detector 116 and the second detector 117 each have a through opening through which the primary electron beam may pass, and they are approximately at the potential of the anode 103 and the beam guide tube 104. The optical axis OA of the SEM 100 passes through the corresponding through openings.

The second detector 117 is used to detect mostly secondary electrons. Secondary electrons emitting from the object 114 have a low kinetic energy and arbitrary direction of movements. However, the secondary electrons are accelerated due to a strong extraction field generated by the tube electrode 113 in the direction of the objective lens 107. The secondary electrons enter the objective lens 107 nearly parallel to the optical axis OA. A diameter of the beam bunch of the secondary electrons is small in the objective lens 107. The objective lens 107, however, affects the beam of secondary electrons and generates a short focus of the secondary electrons having relatively steep angles with respect to the optical axis OA such that the secondary electrons diverge from each other after the focus and may impinge on the second detector 117. Electrons backscattered on the object 114, i.e. backscattered electrons, have a relatively high kinetic energy as compared to secondary electrons when exiting from the object 114. Backscattered electrons are detected only to a very small degree by the second detector 117. The high kinetic energy and the angle of the beam of backscattered electrons with respect to the optical axis OA when backscattered at the object 114 result in a beam waist, i.e. a beam area having a minimal diameter, of the backscattered electrons, the beam waist being arranged in the vicinity of the second detector 117. Therefore, a large part of the backscattered electrons passes through the opening of the second detector 117. Accordingly, backscattered electrons are detected mainly by the first detector 116.

The first detector 116 of a further embodiment of the SEM 100 may have an opposing field grid 116A which is a field grid with an opposing potential. The opposing field grid 116A may be arranged at the side of the first detector 116 facing the object 114. The opposing field grid 116A may comprise a negative potential with respect to the potential of the beam guide tube 104 such that mainly or only backscattered electrons having a high energy may pass the opposing field grid 116A and impinge on the first detector 116. Additionally or alternatively the second detector 117 may have a further opposing field grid being designed similar to the above mentioned opposing field grid 116A of the first detector 116 and having an analog function.

The detection signals generated by the first detector 116 and the second detector 117 are used to generate an image or images of the surface of the object 114. It is pointed out expressly that the aperture openings of the first aperture unit 108 and the second aperture unit 109 as well as the through openings of the first detector 116 and the second detector 117 are represented in an exaggerated manner. The through openings of first detector 116 and the second detector 117 have a maximum length of between 1 mm and 5 mm perpendicular to the optical axis OA. For example, they have a circular design and a diameter in the range of 1 mm to 3 mm perpendicular to the optical axis OA.

In the exemplary embodiment shown here, the second aperture unit 109 is a circular aperture having a second aperture opening 118 for the primary electron beam to pass through, the second aperture opening 118 having an extension in the range of 25 µm to 50 µm, for example, 35 µm. The second aperture unit 109 may be a pressure stage aperture. The second aperture unit 109 of a further exemplary embodiment may have several openings which may be mechanically moved with respect to the primary electron beam or which may be passed through by the primary electron beam using electrical and/or magnetic deflection devices. As mentioned above, the second aperture unit 109 may also be a pressure stage unit. It separates a first area, in which the electron source 101 is arranged, having an ultra-high vacuum ($10^{-7}$ to $10^{-12}$ hPa), from a second area with a high vacuum ($10^{-3}$ to $10^{-7}$ hPa). The second area is the intermediate pressure area of the beam guide tube 104 leading to the object chamber 120.

In addition to the detector system mentioned above, the SEM 100 has a radiation detector 500 which is arranged in the object chamber 120. The radiation detector 500 is, for example, positioned between the beam guide tube 104 and the object 114. Moreover, the radiation detector 500 is positioned at the side of the object 114. The radiation detector 500 may be a CCD-detector.

The object chamber 120 is operated in a first pressure range or in a second pressure range, wherein the first pressure range only comprises pressures lower than or equal to $10^{-3}$ hPa and wherein the second pressure range only comprises pressures equal to or over $10^{-3}$ hPa. A pressure sensor 600 is arranged in the object chamber 120 for measuring the pressure in the object chamber 120. A pump system 601 being connected to the pressure sensor 600 and being arranged at the object chamber 120 provides for the pressure range, either the first pressure range or the second pressure range, in the object chamber 120.

The SEM 100 may further have a third detector 121 which is arranged in the object chamber 120. The third detector 121 is arranged downstream of the object 114 as seen from the electron source 101 in the direction of the object 114 along the optical axis OA. The primary electron beam may be transmitted through the object 114. Electrons of the primary electron beam interact with the material of the object 114. Electrons transmitted through the object 114 will be detected using the third detector 121.

The first detector 116, the second detector 117 and the radiation detector 500 are connected to a control unit 700. The control unit 700 comprises a processor 701 into which a computer program product comprising a program code is loaded, which, when being executed, controls the SEM 100 in such a way that a method according to the system described herein is carried out. This will be explained further below.

Figure 1A:
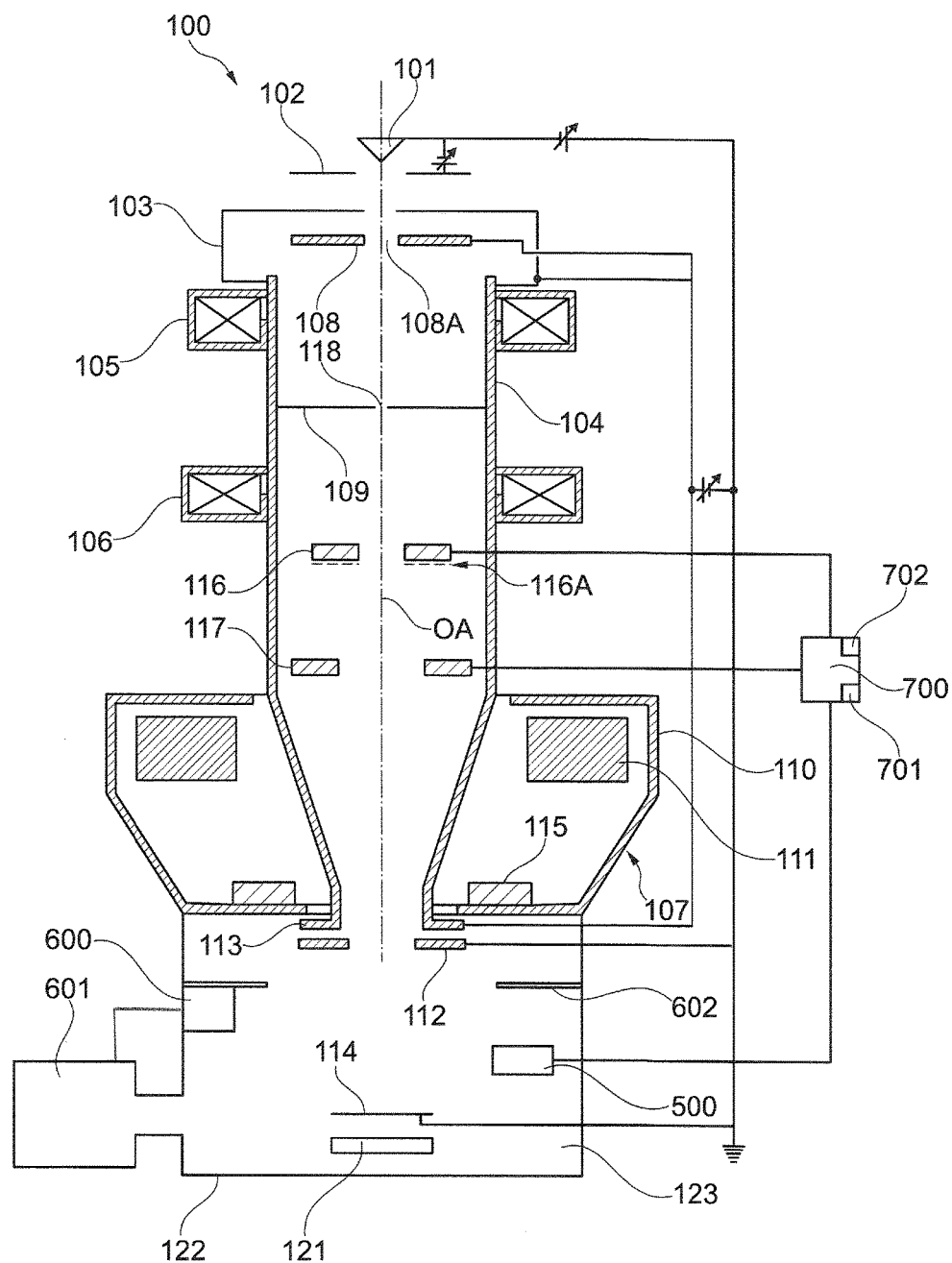
FIG. 1A shows a schematic representation of a second embodiment of a charged particle beam device.

FIG. 1A shows a schematic representation of a further SEM 100. The embodiment of FIG. 1A is based on the embodiment of FIG. 1. Identical reference signs denote identical components. In contrast to the SEM 100 of FIG. 1, the SEM 100 of FIG. 1A comprises an object chamber 122. A pressure limiting aperture 602 is arranged between the beam guide tube 104 and an object area 123 of the object chamber 122. The SEM 100 according to FIG. 1A is suited in particular for the SEM 100 being operated in the second pressure range.

Figure 2:
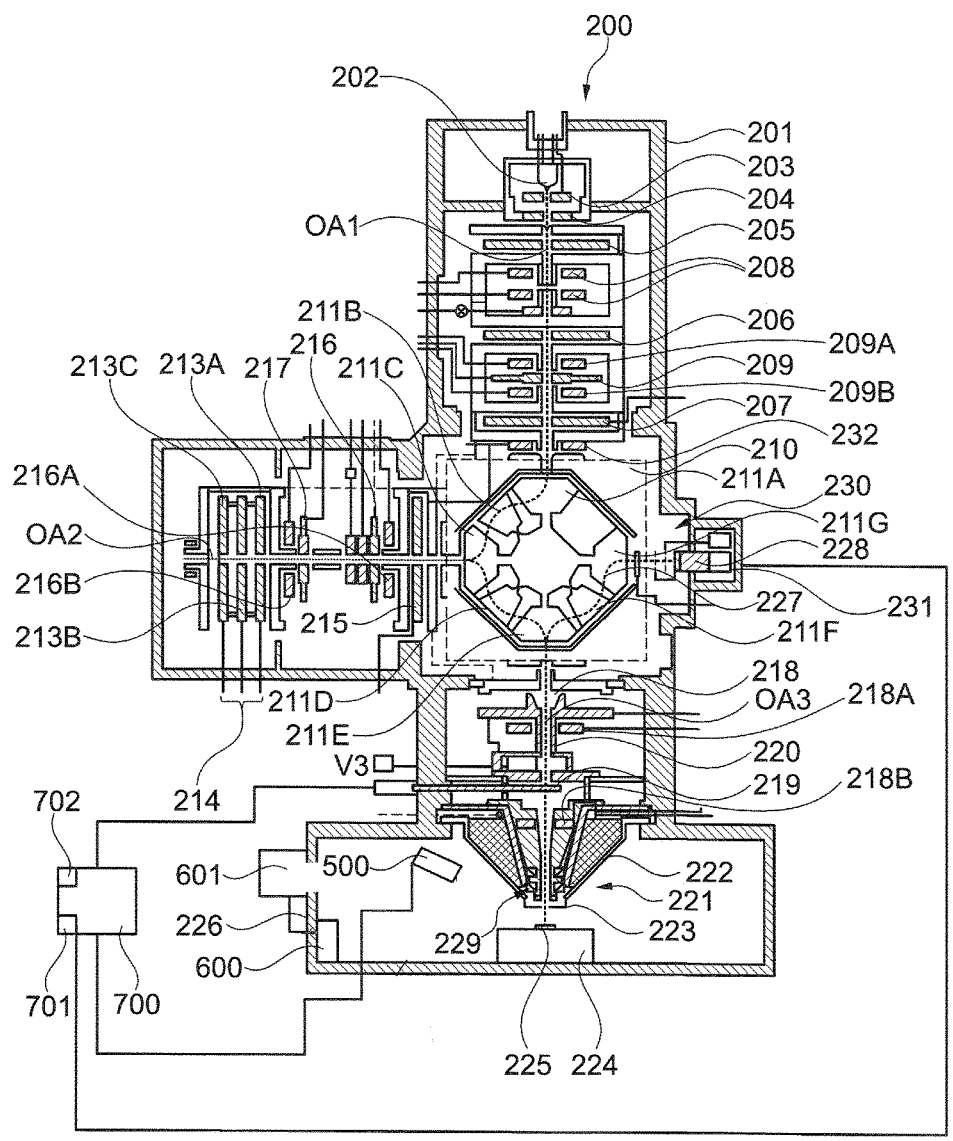
FIG. 2 shows a schematic representation of a third embodiment of a charged particle beam device.

FIG. 2 is a schematic illustration of a further embodiment of a charged particle beam device according to the system described herein. This embodiment of the charged particle beam device is denoted with reference sign 200 and comprises a mirror corrector for correcting, for example, chromatic and spherical aberrations. This will be explained in detail further below. The charged particle beam device 200 comprises a particle beam column 201 being embodied as an electron beam column and, in principle, corresponds to an electron beam column of a corrected SEM. However, the charged particle beam device 200 according to the system described herein is not restricted to an SEM with a mirror corrector. Rather, any charged particle beam device comprising correction units may be used.

The particle beam column 201 comprises a beam generator in the form of an electron source 202 being a cathode, an extraction electrode 203 and an anode 204. By way of example, the electron source 202 may be a thermal field emitter. Electrons which emerge from the electron source 202 are accelerated by the anode 204 as a result of a potential difference between the electron source 202 and the anode 204. Accordingly, a primary particle beam in the form of an electron beam is provided along a first optical axis OA1.

The primary particle beam is guided along a beam path which—after the primary particle beam has emerged from the electron source 202—is approximately the first optical axis OA1, using a first electrostatic lens 205, a second electrostatic lens 206 and a third electrostatic lens 207.

The primary particle beam is adjusted along the beam path using at least one beam alignment device. The beam alignment device of this embodiment comprises a gun alignment unit comprising two magnetic deflection units 208 arranged along the first optical axis OA1. Furthermore, the particle beam device 200 comprises electrostatic beam deflection units. A first electrostatic beam deflection unit 209 is arranged between the second electrostatic lens 206 and the third electrostatic lens 207. The first electrostatic beam deflection unit 209 is also arranged downstream of the magnetic deflection units 208. A first multipole unit 209A in the form of a first magnetic deflection unit is arranged at one side of the first electrostatic beam deflection unit 209. Furthermore, a second multipole unit 209B in the form of a second magnetic deflection unit is arranged at the other side of the first electrostatic beam deflection unit 209. The first electrostatic beam deflection unit 209, the first multipole unit 209A and the second multipole unit 209B are used for adjusting the primary particle beam with respect to an axis of the third electrostatic lens 207 and an entrance window of a beam deflection device 210. The first electrostatic beam deflection unit 209, the first multipole unit 209A and the second multipole unit 209B may act together as a Wien filter. A further magnetic deflection device 232 is arranged at the entrance of the beam deflection device 210.

The beam deflection device 210 is used as a particle-optical beam splitter which deflects the primary particle beam in a specific way. The beam deflection device 210 comprises several magnetic sectors, namely a first magnetic sector 211A, a second magnetic sector 211B, a third magnetic sector 211C, a fourth magnetic sector 211D, a fifth magnetic sector 211E, a sixth magnetic sector 211F and a seventh magnetic sector 211G. The primary particle beam enters the beam deflection device 210 along the first optical axis OA1 and is deflected by the beam deflection device 210 in the direction of a second optical axis OA2. The beam deflection is provided by the first magnetic sector 211A, the second magnetic sector 211B and the third magnetic sector 211C at an angle of 30° to 120°. The second optical axis OA2 is arranged at an identical angle to the first optical axis OA1. The beam deflection device 210 also deflects the primary particle beam which is guided along the second optical axis OA2 in the direction of a third optical axis OA3. The beam deflection is provided by the third magnetic sector 211C, the fourth magnetic sector 211D and the fifth magnetic sector 211E. In the embodiment shown in FIG. 2, deflecting to the second optical axis OA2 and to the third optical axis OA3 will be done by deflecting the primary particle beam at an angle of 90°. Thus, the third optical axis OA3 runs coaxially to the first optical axis OA1. However, the charged particle beam device 200 according to the system described herein is not restricted to deflection angles of 90°. Instead, any suitable deflection angle may be used with the beam deflection device 210, for example 70' or 110° such that the first optical axis OA1 does not run coaxially to the third optical axis OA3. For further details of the beam deflection device 210 reference is made to WO 2002/067286 A2, which is incorporated herein by reference.

After being deflected by the first magnetic sector 211A, the second magnetic sector 211B and the third magnetic sector 211C, the primary particle beam is guided along the second optical axis OA2. The primary particle beam is guided to an electrostatic mirror 214 and passes—on its way to the electrostatic mirror 214—a fourth electrostatic lens 215, a third multipole unit 216A in the form of a magnetic deflection unit, a second electrostatic beam deflection unit 216, a third electrostatic beam deflection unit 217 and a fourth multipole unit 216B in the form of a magnetic deflection unit. The electrostatic mirror 214 comprises a first mirror electrode 213A, a second mirror electrode 213B and a third mirror electrode 213C. Electrons of the primary particle beam which are reflected back by the electrostatic mirror 214 run again along the second optical axis OA2 and enter again the beam deflection device 210. They are deflected by the third magnetic sector 211C, the fourth magnetic sector 211D and the fifth magnetic sector 211E towards the third optical axis OA3. The electrons of the primary particle beam exit the beam deflection device 210, being guided along the third optical axis OA3 to the object 225 to be examined. On its way to the object 225, the primary particle beam passes a fifth electrostatic lens 218, a beam guiding tube 220, a fifth multipole unit 218A, a sixth multipole unit 218B and an objective lens 221. The fifth electrostatic lens 218 is an electrostatic immersion lens. The primary particle beam is decelerated or accelerated by the fifth electrostatic lens 218 to the electrical potential of the beam guiding tube 220.

The primary particle beam is focused by the objective lens 221 in a focal plane in which the object 225 is positioned. The object 225 is arranged on a movable sample stage 224. The movable sample stage 224 is arranged in an object chamber 226 of the charged particle beam device 200.

The objective lens 221 may be implemented as a combination of a magnetic lens 222 and a sixth electrostatic lens 223. The end of the beam guiding tube 220 may be one electrode of an electrostatic lens. Particles of the primary particle beam, after exiting from the beam guiding tube 220, are decelerated to the potential of the object 225 arranged on the sample stage 224. The objective lens 221 is not restricted to a combination of the magnetic lens 222 and the sixth electrostatic lens 223. Instead, the objective lens 221 may be implemented in any suitable form. In particular, the objective lens 221 may also be just a mere magnetic lens or just a mere electrostatic lens.

The primary particle beam focused on the object 225 interacts with the object 225. Interaction particles and interaction radiation are generated. In particular, secondary electrons are emitted by the object 225 and backscattered electrons are returned from the object 225. The secondary electrons and the backscattered electrons are again accelerated and are guided into the beam guiding tube 220 along the third optical axis OA3. In particular, the secondary electrons and backscattered electrons travel on the beam path of the primary particle beam in the opposite direction of the primary particle beam.

The charged particle beam device 200 comprises a first detector 219 which is arranged along the beam path between the beam deflection device 210 and the objective lens 221. Secondary electrons which are guided in directions oriented at large angles with respect to the third optical axis OA3 are detected by the first detector 219. However, backscattered electrons and secondary electrons which are guided in directions having a small axial distance with respect to the third optical axis OA3 at the first detector 219, i.e. backscattered electrons and secondary electrons having a small distance to the third optical axis OA3 at the position of the first detector 219, enter the beam deflection device 210 and are deflected by the fifth magnetic sector 211E, the sixth magnetic sector 211F and the seventh magnetic sector 211G along a detection beam path 227 to a second detector 228 of an analysis unit 231. The total deflection angle may be, for example, 90° or 110°.

The first detector 219 generates detection signals mostly based on the emitted secondary electrons. The second detector 228 of the analysis unit 231 generates detection signals mostly based on backscattered electrons. The detection signals generated by the first detector 219 and the second detector 228 are transmitted to a control unit 700 and are used to obtain information about the properties of the interaction area of the focused primary particle beam with the object 225. If the focused primary particle beam is scanned over the object 225 using a scanning device 229, and if the control unit 700 acquires and stores the detection signals generated by the first detector 219 and the second detector 228, an image of the scanned area of the object 225 can be acquired and displayed by the control unit 700 or a monitor (not shown).

A filter electrode 230 may be arranged in front of the second detector 228 of the analysis unit 231. The filter electrode 230 may be used to separate the secondary electrons from the backscattered electrons due to the kinetic energy difference between the secondary electrons and the backscattered electrons.

In addition to the first detector 219 and the second detector 228, the charged particle beam device 200 also has a radiation detector 500 which is arranged in the object chamber 226. The radiation detector 500 is positioned at the side of the object 225 and is directed to the object 225. The radiation detector 500 may be a CCD-detector and detects interaction radiation arising from the interaction of the primary particle beam with the object 225, in particular X-rays and/or cathodoluminescence light.

The object chamber 226 is operated in a first pressure range or in a second pressure range, wherein the first pressure range only comprises pressures lower than or equal to $10^{-3}$ hPa and wherein the second pressure range only comprises pressures equal to or over $10^{-3}$ hPa. A pressure sensor 600 is arranged in the object chamber 226 for measuring the pressure in the object chamber 226. A pump system 601 being connected to the pressure sensor 600 and being arranged at the object chamber 226 provides for the pressure range in the object chamber 226, either the first pressure range or the second pressure range.

The first detector 219, the second detector 228 of the analysis unit 231 and the radiation detector 500 are connected to the control unit 700. The control unit 700 comprises a processor 701 into which a computer program product comprising a program code is loaded, which, when being executed, controls the charged particle beam device 200 in such a way that a method according to the system described herein is carried out. This will be explained further below.

Figure 3:
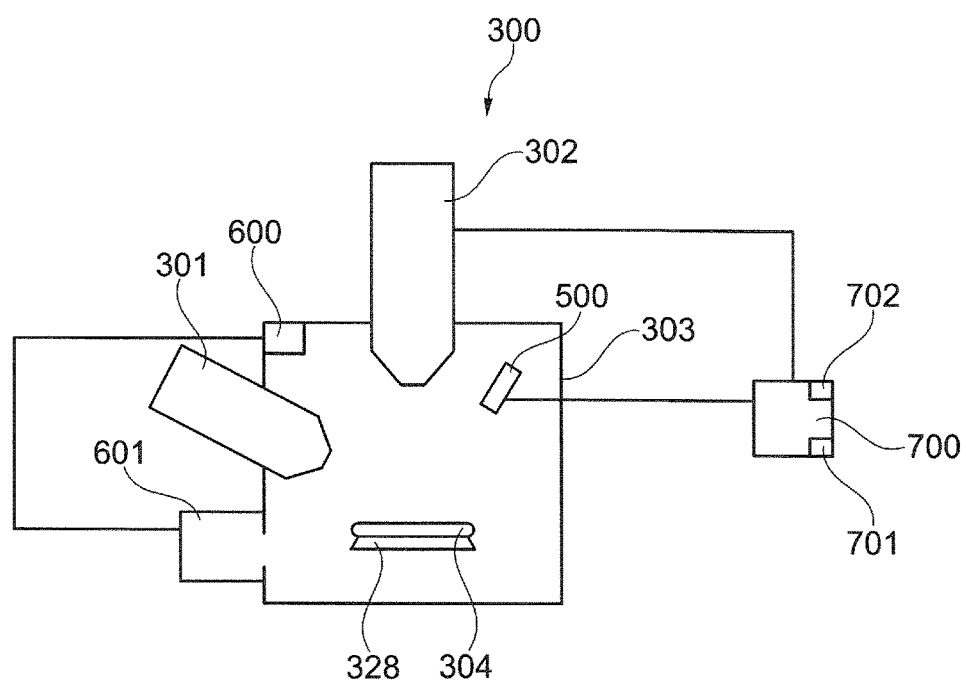
FIG. 3 shows a schematic representation of a fourth embodiment of a charged particle beam device.

FIG. 3 shows a schematic illustration of another embodiment of a charged particle beam device 300 according to the system described herein. The charged particle beam device 300 has a first particle beam column 301 in the form of an ion beam column, and a second particle beam column 302 in the form of an electron beam column. The first particle beam column 301 and the second particle beam column 302 are arranged on an object chamber 303, in which an object 304 to be analyzed and/or processed is arranged. It is explicitly noted that the system described herein is not restricted to the first particle beam column 301 being in the form of an ion beam column and the second particle beam column 302 being in the form of an electron beam column. In fact, the system described herein also provides for the first particle beam column 301 to be in the form of an electron beam column and for the second particle beam column 302 to be in the form of an ion beam column. A further embodiment of the system described herein provides for both the first particle beam column 301 and the second particle beam column 302 each to be in the form of an ion beam column.

Figure 4:
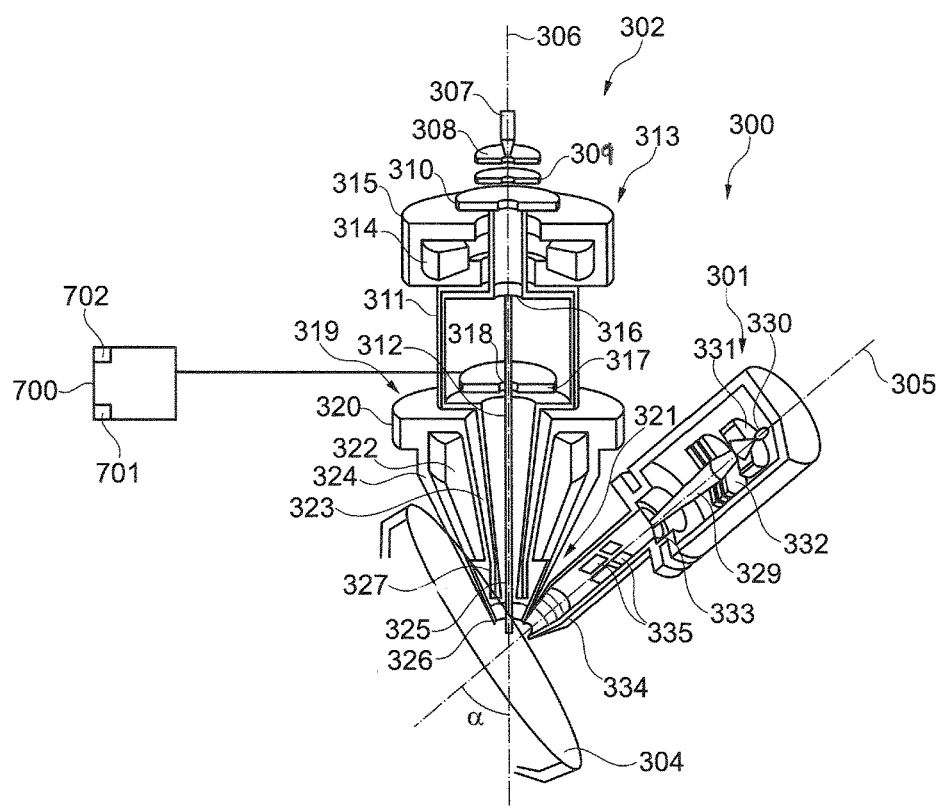
FIG. 4 shows a further schematic representation of the charged particle beam device according to FIG. 3.

FIG. 4 shows a detailed illustration of the charged particle beam device 300 shown in FIG. 3. For clarity reasons, the object chamber 303 is not illustrated. The first particle beam column 301 in the form of the ion beam column has a first optical axis 305. Furthermore, the second particle beam column 302 in the form of the electron beam column has a second optical axis 306.

The second particle beam column 302, in the form of the electron beam column, will be described next. The second particle beam column 302 has a second beam generator 307, a first electrode 308, a second electrode 309 and a third electrode 310. By way of example, the second beam generator 307 is a thermal field emitter. The first electrode 308 has the function of a suppressor electrode, while the second electrode 309 has the function of an extractor electrode. The third electrode 310 is an anode, and at the same time forms one end of a beam guide tube 311.

A second particle beam 312 in the form of an electron beam is generated by the second beam generator 307. Electrons which emerge from the second beam generator 307 are accelerated to the anode potential, for example in the range from 1 kV to 30 kV, as a result of a potential difference between the second beam generator 307 and the third electrode 310. The second particle beam 312 in the form of the electron beam passes through the beam guide tube 311, and is focused onto the object 304 to be analyzed and/or processed. This will be described in more detail further below.

The beam guide tube 311 passes through a collimator arrangement 313 which has a first annular coil 314 and a yoke 315. Seen in the direction of the object 304, from the second beam generator 307, the collimator arrangement 313 is followed by a pinhole diaphragm 316 and a detector 317 with a central opening 318 arranged along the second optical axis 306 in the beam guide tube 311.

The beam guide tube 311 then runs through a hole in a second objective lens 319. The second objective lens 319 is used for focusing the second particle beam 312 onto the object 304. For this purpose, the second objective lens 319 has a magnetic lens 320 and an electrostatic lens 321. The magnetic lens 320 is provided with a second annular coil 322, an inner pole piece 323 and an outer pole piece 324. The electrostatic lens 321 comprises an end 325 of the beam guide tube 311 and a terminating electrode 326.

The end 325 of the beam guide tube 311 and the terminating electrode 326 concurrently form an electrostatic deceleration device. The end 325 of the beam guide tube 311, together with the beam guide tube 311, is at the anode potential, while the terminating electrode 326 and the object 304 are at a potential which is lower than the anode potential. This allows the electrons of the second particle beam 312 to be decelerated to a desired energy which is required for examination of the object 304.

The second particle beam column 302 furthermore has a raster device 327, by which the second particle beam 312 can be deflected and can be scanned in the form of a raster over the object 304.

For imaging purposes, the detector 317 which is arranged in the beam guide tube 311 detects secondary electrons and/or backscattered electrons, which result from the interaction between the second particle beam 312 and the object 304. The signals generated by the detector 317 are transmitted to a control unit 700.

Interaction radiation, for example X-rays or cathodoluminescence light, may be detected by using a radiation detector 500, for example a CCD-detector, which is arranged in the object chamber 303 (see FIG. 3). The radiation detector 500 is positioned at the side of the object 304 and is directed to the object 304.

The object 304 is arranged on an object holder 328 in the form of a sample stage as shown in FIG. 3, by which the object 304 is arranged such that it can move along three axes which are arranged to be mutually perpendicular (specifically an x-axis, a y-axis and a z-axis). Furthermore, the sample stage can be rotated about two rotation axes which are arranged to be mutually perpendicular. It is therefore possible to move the object 304 to a desired position. The rotation of the object holder 328 about one of the two rotation axes may be used to tilt the object holder 328 such that the surface of the object 304 may be oriented perpendicular to the second particle beam 312 or to the first particle beam 329, which will be described further below. Alternatively, the surface of the object 304 may be oriented in such a way that the surface of the object 304 on one hand and the first particle beam 329 or the second particle beam 312 on the other hand are at an angle, for example in the range of 0° to 90°.

As mentioned previously, reference symbol 301 denotes the first particle beam column, in the form of the ion beam column. The first particle beam column 301 has a first beam generator 330 in the form of an ion source. The first beam generator 330 is used for generating the first particle beam 329 in the form of an ion beam. Furthermore, the first particle beam column 301 is provided with an extraction electrode 331 and a collimator 332. The collimator 332 is followed by a variable aperture 333 in the direction of the object 304 along the first optical axis 305. The first particle beam 329 is focused onto the object 304 by a first objective lens 334 in the form of focusing lenses. Raster electrodes 335 are provided, in order to scan the first particle beam 329 over the object 304 in the form of a raster.

When the first particle beam 329 strikes the object 304, the first particle beam 329 interacts with the material of the object 304. In the process, interaction radiation is generated and detected using the radiation detector 500. Interaction particles are generated, in particular secondary electrons and/or secondary ions. These are detected using the detector 317.

The object chamber 303 is operated in a first pressure range or in a second pressure range, wherein the first pressure range only comprises pressures lower than or equal to $10^{-3}$ hPa and wherein the second pressure range only comprises pressures equal to or over $10^{-3}$ hPa. A pressure sensor 600 is arranged in the object chamber 303 for measuring the pressure in the object chamber 303 (see FIG. 3). A pump system 601 being connected to the pressure sensor 600 and arranged at the object chamber 303 provides for the pressure range in the object chamber 303, either the first pressure range or the second pressure range.

The first particle beam 329 may also be used to process the object 304. For example, material may be deposited on the surface of the object 304 using the first particle beam 329, wherein the material is provided with a gas injection system (GIS). Additionally or alternatively, structures may be etched into the object 304 using the first particle beam 329. Moreover, the second particle beam 312 may be used to process the object 304, for example by electron beam induced deposition.

The detector 317 and the radiation detector 500 are connected to the control unit 700 as shown in FIGS. 3 and 4. The control unit 700 comprises a processor 701 into which a computer program product comprising a program code is loaded, which, when being executed, controls the charged particle beam device 300 in such a way that a method according to the system described herein is carried out. This will be explained further below.

An embodiment of the method according to the system described herein will now be explained, the method being carried out using the SEM 100 according to FIG. 1. It is noted that the method may also be carried out with other charged particle beam devices, in particular the SEM 100 of FIG. 1A, the charged particle beam device 200 of FIG. 2 and the charged particle beam device 300 of FIGS. 3 and 4.

Figure 5:
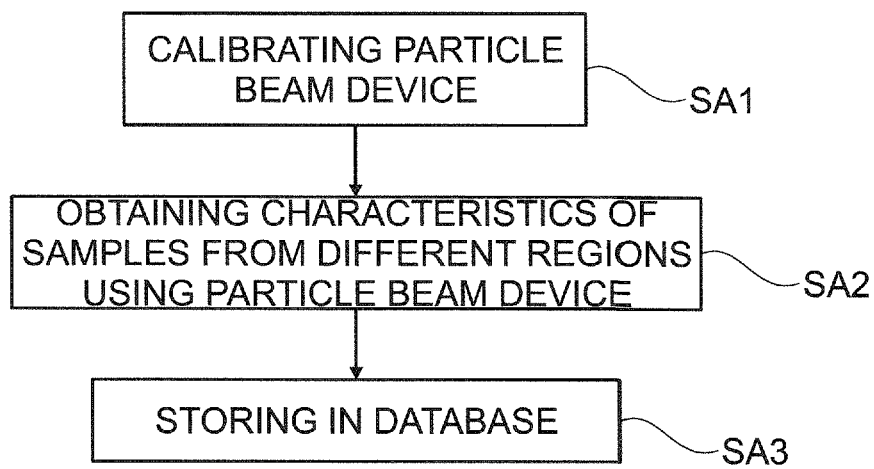
FIG. 5 shows a flow chart of an embodiment of a method obtaining characteristics of minerals.

As shown in FIGS. 1, 1A, 2 to 4, the control unit 700 also comprises a database 702. The database 702 is a look up table comprising information about particles in the form of minerals. In a preferred embodiment the database 702 comprises characteristics of minerals from real life samples from different regions globally. The information about the particles is obtained once and stored in the database 702. An embodiment of obtaining such information is shown in FIG. 5. A charged particle beam device, for example the SEM 100 of FIG. 1, is calibrated. Therefore, a specific mode of operation of the SEM 100 is determined. In particular, the landing energy of the primary electrons impinging on the object 114 is chosen (for example 15 keV). Moreover, the first detector 116, the second detector 117, the third detector 121 and the radiation detector 500 are calibrated by guiding the primary electron beam to a known standard calibration object as the object 114 and by detecting interaction particles and interaction radiation in method step SA1. Control parameters such as signal amplification or detector voltages of the first detector 116, the second detector 117, the third detector 121 and the radiation detector 500 are chosen in such a way that the image and the radiation spectrum of the known standard calibration object are obtained in a specific way. After calibration, characteristics of samples in the form of minerals from different regions globally are obtained in method step SA2. In particular, the information comprises the gray level which each mineral usually has in an image generated by interaction particles. This gray level may be determined by initially analyzing such particles in the SEM 100, generating an image using interaction particles such as secondary electrons and/or backscattered electrons. Moreover, a gray level histogram is generated. The gray level histogram of an image of a specific particle is a histogram of pixel intensity values of pixels in the image. The histogram comprises the counts of pixel having a specific gray level intensity. Usually, the histogram shows high distribution of pixels in the form of a peak. The centroid of the peak is determined and is used as the gray level for this specific particle and is stored in the database 702 in method step SA3. Alternatively, any other method suitable for determining the gray level for a specific particle in the histogram may be used, in particular statistical methods like a Gaussian model.

Figure 6:
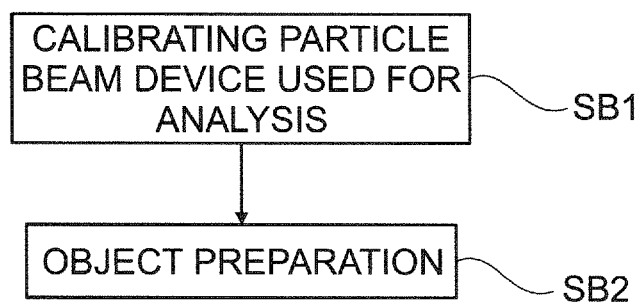
FIG. 6 shows a flow chart of an embodiment of a method calibrating a charged particle beam device and preparing an object to be analyzed.

FIG. 6 shows method steps of an embodiment of the method according to the system described herein preparing the SEM 100 for analysis and the object to be analyzed.

Since the charged particle beam device used for obtaining the information stored in the database 702 and the charged particle beam device used for analyzing an unknown object may not be identical, it is preferred to calibrate the charged particle beam device used for the analysis in method step SB1. If the analysis is carried out using the SEM 100, the SEM 100 is calibrated. The SEM 100 is calibrated by choosing the identical landing energy of the primary electrons used for obtaining the above mentioned characteristics, namely 15 keV. Moreover, the first detector 116, the second detector 117, the third detector 121 and the radiation detector 500 are calibrated by guiding the primary electron beam to the known standard calibration object as the object 114 and by detecting interaction particles and interaction radiation. Control parameters such as signal amplification or detector voltages of the first detector 116, the second detector 117, the third detector 121 and the radiation detector 500 are chosen in such a way that the image and the radiation spectrum of the known standard calibration object are obtained in the specific way used for obtaining the characteristics.

The object to be analyzed is prepared in method step SB2. For example, the surface of the object to be analyzed may be polished using the charged particle beam device 300 of FIGS. 3 and 4. Additionally, the object to be analyzed may be coated with a conductive material such as carbon or a metal to minimize charge accumulation on the surface of the object to be analyzed.

Figure 7:
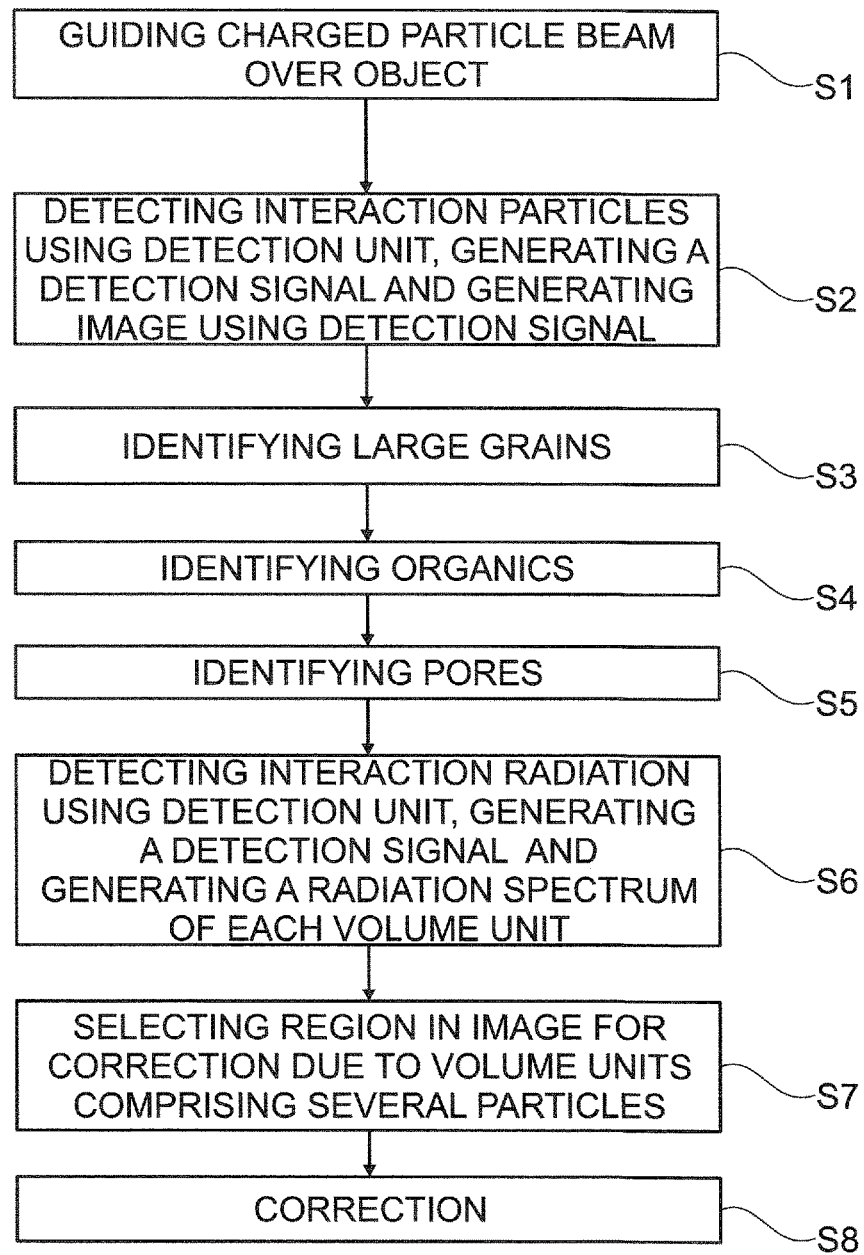
FIG. 7 shows a flow chart of an embodiment of the method according to the system described herein.
Figure 8:
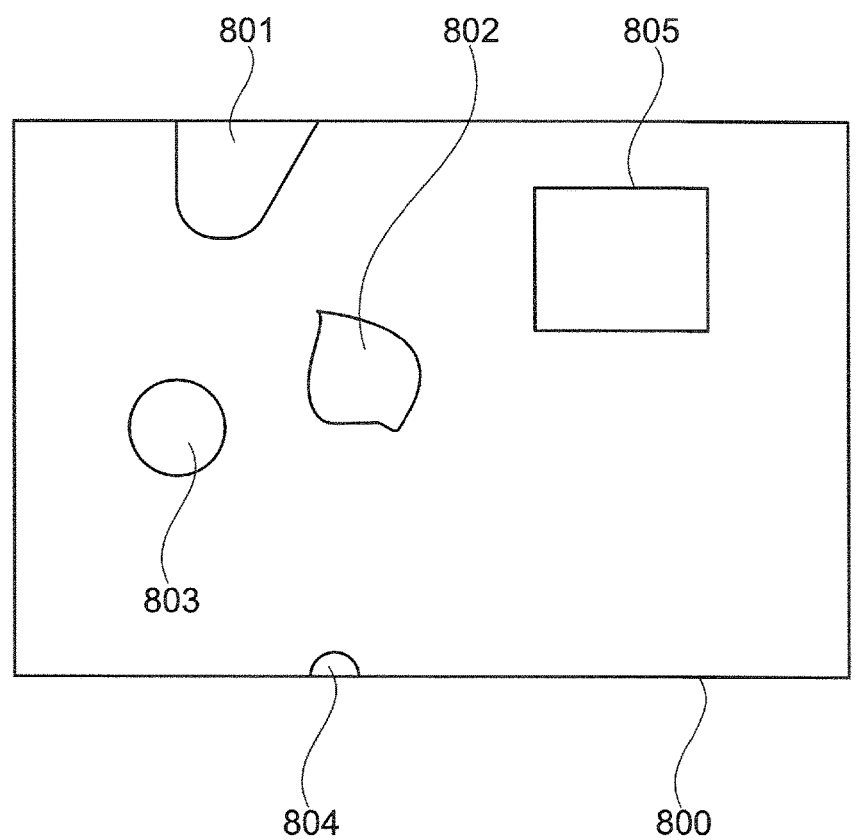
FIG. 8 shows an image of an object, wherein the image is generated using a charged particle beam device.

A flow chart of the embodiment of the method is shown in FIG. 7. The charged particle beam in the form of the primary electron beam is guided over the object 114 in a method step S1 by using the scanning device 115. In a further method step S2, interaction particles in the form of backscattered electrons are detected by using the first detector 116 and/or secondary electrons are detected by using the second detector 117. The first detector 116 and the second detector 117 generate first detection signals which may be used for generating an image of the object 114. The generated image 800 of the object 114 is shown in a schematic representation in FIG. 8. The resolution of the image 800 may be smaller than 100 nm.

Figure 9:
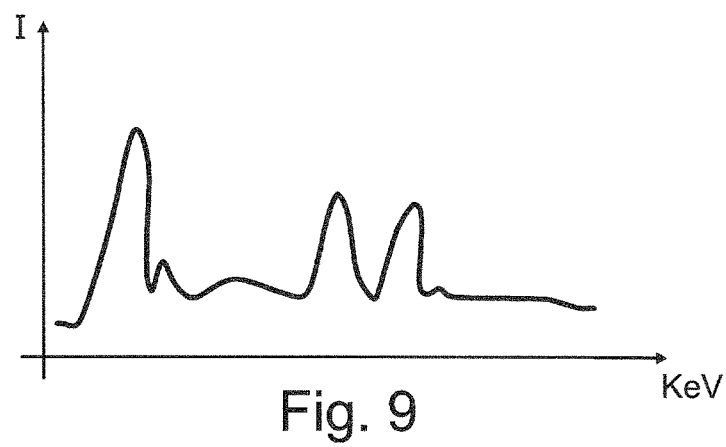
FIG. 9 shows a radiation spectrum of an object, wherein the radiation spectrum is used for EDX.

The embodiment of the method according to the system described herein now identifies large grains of particles, for example minerals, in method step S3. A large grain is, for example, larger than 2 μm. The large grain of mineral may have a volume of 2 μm×2 μm×2 μm. A first large grain 801 and a second large grain 802 are identified in the image 800 (see FIG. 8). The compositions of the first large grain 801 and the second large grain 802 may be identified using the radiation spectrum by carrying out EDX. The charged particle beam in the form of the primary electron beam may be guided to the center of the first large grain 801 and, subsequently, to the second large grain 802. Interaction radiation is detected using the radiation detector 500. As mentioned above, the interaction radiation may be X-rays or cathodoluminescence light. In this embodiment of the method according to the system described herein, X-rays are detected. The radiation detector 500 generates second detection signals. A radiation spectrum of the first large grain 801 and a radiation spectrum of the second large grain 802 are generated. Each radiation spectrum comprises, for example, the signal intensity dependent on the energy of the X-rays. A schematic representation of such a radiation spectrum is shown in FIG. 9. The radiation spectrum may be used for EDX. Therefore, after having carried out method step S3, the positions of the large grains in the image 800 and their compositions are known.

Furthermore, organic particles are identified in method step S4 using the image 800. For example, an organic particle 803 is identified. The organic particle 803 is assigned a given chemical composition, for example a given chemical composition of 95 weight % carbon and 5 weight % oxygen. Such composition of organic material is rather common and accurate. Therefore, after having carried out method step S4, the positions of the organic particles in the image 800 and their compositions are known.

Moreover, pores are identified in method step S5 using the image 800. For example, a pore 804 is identified. Therefore, after having carried out method step S5, the positions of pores in the image 800 are known.

Figure 10:
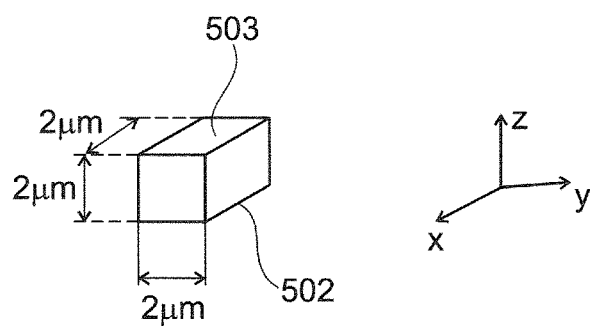
FIG. 10 shows a volume unit of an object to be analyzed.

Method step S6 now comprises guiding the charged particle beam in the form of the primary electron beam over the object 114. Every 2 μm the charged particle beam is stopped and interaction radiation is detected using the radiation detector 500. As mentioned above, the interaction radiation may be X-rays or cathodoluminescence light. In this embodiment of the method according to the system described herein, X-rays are detected. The radiation detector 500 generates a second detection signal. Furthermore, a radiation spectrum is generated using the second detection signal at each stop of the charged particle beam. The radiation spectrum comprises, for example, the signal intensity dependent on the energy of the X-rays. Each radiation spectrum represents a volume unit 502 of the object 114, as shown in FIG. 10. The volume unit 502 has a first extension along a first axis in the form of an x-axis, a second extension along a second axis in the form of a y-axis and a third extension along a third axis in the form of a z-axis. The first axis, the second axis and the third axis may be arranged perpendicular to each other. The first extension, the second extension and/or the third extension may be 2 μm. However, the first extension, the second extension and/or the third extension are not restricted to this value. Instead, any suitable value may be chosen. The volume unit 502 has a volume unit surface 503 being spanned by the first axis and the second axis.

The image resolution of the image 800 is less than at least one of: the first extension, the second extension and the third extension. According to one embodiment of the system described herein, the image resolution is 100 nm, whereas the first extension, the second extension and the third extension are 2 μm.

Figure 11:
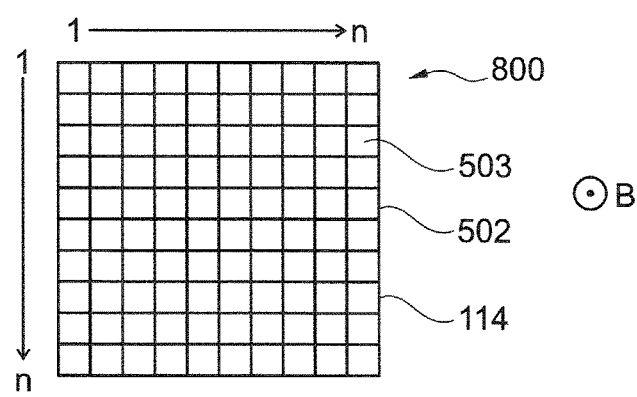
FIG. 11 shows several volume units of an object to be analyzed.

The object 114 as shown in the image 800 comprises several volume units 502 being schematically shown in FIG. 11. The object 114 of the embodiment shown in FIG. 11 comprises an array of n×n volume units 502 facing with their volume unit surfaces 503 in the direction of the charged particle beam B. The charged particle beam B impinges on the object 114 substantially perpendicular to the plane of the drawing sheet. The image 800 generated with the interaction particles covers all volume units 502.

Figure 7A:
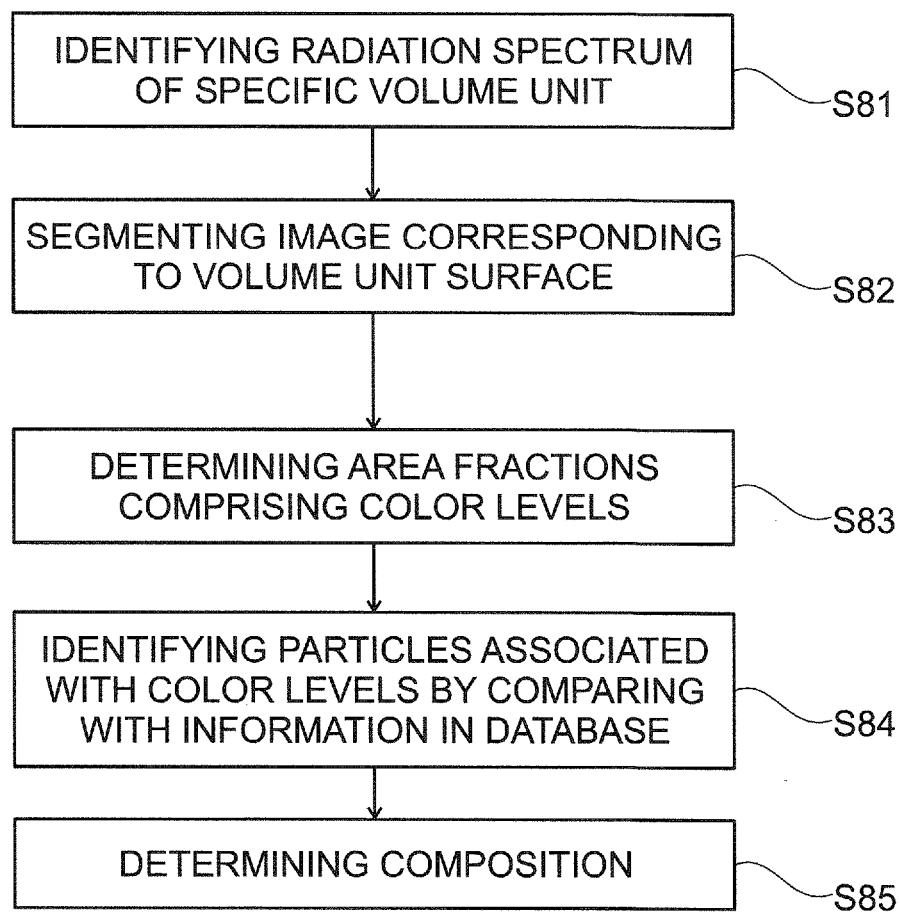
FIG. 7A shows a further flow chart of an embodiment of the method according to the system described herein.

In method step S7, a region 805 in the image 800 is now selected, for example by a user since it is recognized that this region 805 comprises volume units 502 which each may comprise several minerals. One of those volume units 502 is selected and considered. The radiation spectrum of this considered volume unit 502, namely an EDX spectrum which is generated based on X-rays emitted from the considered volume unit 502, may comprise not only information about a single mineral, but also about further surrounding minerals located in the considered volume unit 502. Therefore, the information provided by the EDX spectrum may be impossible to understand or may lead to a false result. Accordingly, a correction is carried out in method step S8. A flow chart of the correction is shown in FIG. 7A.

The radiation spectrum of the considered volume unit 502 is identified in method step S81. As mentioned above, the radiation spectrum is an EDX spectrum which is generated based on X-rays emitted from the considered volume unit 502. For example, the radiation spectrum reveals the information that the considered volume unit 502 comprises 7 weight % C, 45 weight % O, 14 weight % Si, 5.3 weight % S, 24 weight % Ca and 4.7 weight % Fe. The aim is to identify the minerals being located in the considered volume unit 502.

Figure 12:
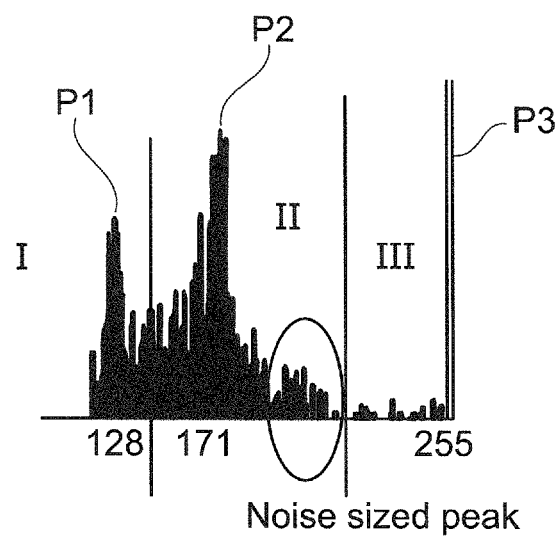
FIG. 12 shows a schematic representation of a gray level histogram comprising peaks.

The embodiment of the method according to the system described herein also comprises the step of segmenting the part of the image 800 corresponding to the volume unit surface 503 of the considered volume unit 502 in step S82 into color segments, for example gray segments. For the volume unit 502 and the volume unit surface 503, respectively, the part of the image 800 generated using the interaction particles and having the higher resolution, is segmented in such a way that the part of the image 800 comprises an area having three color levels, namely a first color level, a second color level and a third color level. The first color level, the second color level and/or the third color level may be a gray level. The gray levels are determined by using a gray level histogram of the volume unit surface 503 of the considered volume unit 502. As mentioned above, the gray level histogram of the image 800 of the object 114 is a histogram of pixel intensity values of pixels in an image, i.e. the image generated using the interaction particles. The histogram comprises the counts of pixel having a specific gray level intensity. The histogram shows high distribution of pixels in the form of peaks. If three peaks are shown in the histogram, those three peaks are identified as the first color level in the form of the first gray level (first peak), as the second color level in the form of the second gray level (second peak) and as the third color level in the form of the third gray level (third peak). FIG. 12 schematically shows one example of a gray level histogram comprising three peaks, namely peak P1 at intensity 128, peak P2 at intensity 171 and peak P3 at intensity 255. If more than three peaks are shown in the gray level histogram, then only the most intense three peaks are chosen. In order to be able to identify peaks and to minimize the noise in the gray level histogram, the gray level histogram may be smoothed using a smoothing filter, for example $$H_{Output}(i) = \frac{1}{W} \sum_{j=-\frac{W-1}{2}}^{\frac{W-1}{2}} H_{input}(i-j)$$

Figure 13:
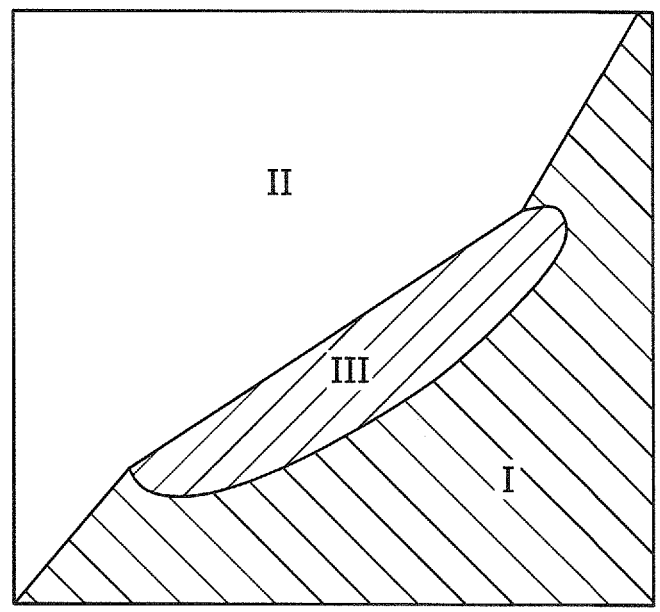
FIG. 13 shows a schematic representation of a segmented part of the image of an object to be analyzed.

The segmentation is carried out by identifying the beginning and the end of the peaks P1 to P3. This may be done by simply dividing the distance of two adjacent peaks in half or, for example, by using a statistic method such as the Gaussian mixture model known as GMM. Therefore, in the embodiment shown in FIG. 12, three segments in the part of the image 800 referring to the considered volume unit 502 are generated, namely segment I, segment II and segment III. The part of the image 800 showing the volume unit surface 503 of the considered volume unit 502 is shown in FIG. 13. Segment I has the first color level (for example the first gray level). Segment II has the second color level (for example the second gray level), and segment III has the third color level (for example the third gray level).

The embodiment of the method according to the system described herein also comprises the step of determining a first area fraction of the area of the volume unit surface 503 comprising the first gray level, determining a second area fraction of the area of the volume unit surface 503 comprising the second gray level, and determining a third area fraction of the area of the volume unit surface 503 comprising the third gray level in a method step S83. This can be done by measuring the area fractions using the part of the image 800 corresponding to the considered volume unit surface 503. As an example, it is assumed that the first area fraction of the area of the volume unit surface 503 comprising the first gray level of the segment I is 30% of the area of the volume unit surface 503, the second area fraction of the area of the volume unit surface 503 comprising the second gray level of the segment II is 60% of the area of the volume unit surface 503 and the third area fraction of the area of the volume unit surface 503 comprising the third gray level of the segment III is 10% of the area of the volume unit surface 503.

The embodiment of the method according to the system described herein also comprises the step of identifying particles associated with the gray levels by comparing each gray level with the information stored in the database 702 in method step S84. As mentioned above, the database 702 is a look up table comprising information about particles in the form of minerals. The information also comprises the gray level which each particle in the form of a mineral usually has in an image being generated using interaction particles. Therefore, by comparing the gray levels, it is possible to identify the potential particles in the form of minerals which may be located in the considered volume unit 502. Accordingly, the first particle in the form of a first mineral is identified by comparing the first gray level with the information stored in the database 702. Likewise, the second particle in the form of a second mineral is identified by comparing the second gray level with the information stored in the database 702. The third particle in the form of a third mineral is identified by comparing the third gray level with the information stored in the database 702. However, since several minerals only slightly differ from each other, it might be that they have the same gray level in an image being generated using interaction particles. Therefore, the database 702 may comprise the identical gray level for different particles in the form of minerals. If the gray level obtained in the image 800 of the object 114 is associated with several particles in the form of minerals, the database 702 will provide all minerals associated with this obtained gray level. The user may select some of the minerals for each obtained gray level which, according to the user's assumption, may be located in the volume unit 502.

For example, the method step S84 reveals the following potential minerals:

potential minerals having the first gray level: illite, quartz and albite (hereinafter referred to as mineral 1).

potential minerals having the second gray level: biotite, siderophyllite, calcite, chamosite and muscovite (hereinafter referred to as mineral 2);

potential minerals having the third gray level are rutile, pyrite and sphalerite (hereinafter referred to as mineral 3).

The embodiment of the method according to the system described herein also comprises the step of determining a composition of the considered volume unit 502 in method step S85. This step uses the information about the identified first particle in the form of the mineral 1, the first area fraction, the information about the second particle in the form of the mineral 2, the second area fraction, the information about the third particle in the form of the mineral 3 and the third area fraction. The composition of the considered volume unit 502 is proportionally composed of the first particle in the form of the mineral 1 in a quantity of the first area fraction, of the second particle in the form of the mineral 2 in a quantity of the second area fraction and of the third particle in the form of the mineral 3 in a quantity of the third area fraction. In other words, the proportion of the first particle in the composition of the considered volume unit 502 is equal to the proportion of the first area fraction in the entire area of the volume unit surface 503. Moreover, the proportion of the second particle in the composition of the considered volume unit 502 is equal to the proportion of the second area fraction in the entire area of the volume unit surface 503. Furthermore, the proportion of the third particle in the composition of the considered volume unit 502 is equal to the proportion of the third area fraction in the entire area of the volume unit surface 503.

However, the mineral 1 may be one of several potential minerals as mentioned above. Moreover, the mineral 2 may be one of several potential minerals as mentioned above. Additionally, the mineral 3 may be one of several potential minerals as mentioned above. Therefore, a solution of the following has to be found: The composition mineral 1×0.3
mineral 2×0.6
mineral 3×0.1 should be equal to the composition provided by the radiation spectrum of the considered volume unit 502 as mentioned above, namely 7 weight % C, 45 weight % O, 14 weight % Si, 5.3 weight % S, 24 weight % Ca and 4.7 weight % Fe.

Mineral 1 may be one of: illite, quartz and albite. Therefore, mineral 1 is 1 out of 3 minerals.

Mineral 2 may be one of: biotite, siderophyllite, calcite, chamosite and muscovite.

Therefore, mineral 2 is 1 out of 5 minerals.

Mineral 3 may be one of: rutile, pyrite and sphalerite. Therefore, mineral 3 is 1 out of 3 minerals.

Therefore, 3×5×3 combinations of the minerals are possible (45 combinations) which could provide the composition provided with the radiation spectrum. Accordingly, each of these 45 combinations is now determined by numerical calculations and compared with the composition provided with the radiation spectrum. The determined composition which comes closest to the composition provided by the radiation spectrum is selected. The step of comparing uses, for example, the method of least squares.

As an example, one of the 45 possible combinations is a combination of quartz as mineral 1, calcite as mineral 2 and pyrite as mineral 3. Quartz is composed of 53.3 weight % O and 46.7 weight % Si. Calcite is composed of 12 weight % C, 48 weight % O and 40 weight % Ca. Pyrite is composed of 53.4 weight % S and 46.6 weight % Fe. Therefore, using this determined combination, the considered volume unit 502 comprises the composition (53.3 weight % O; 46.7 weight % Si)×0.3

(12 weight % C, 48 weight % O and 40 weight % Ca)×0.6

(53.4 weight % S and 46.6 weight % Fe)×0.1

This results in a determined composition of the considered volume unit 502 based on this combination of 7.2 weight % C, 44.8 weight % O, 14 weight % Si, 5.34 weight % S, 24 weight % Ca, 4.7 weight % Fe. This is rather close to the composition provided with the radiation spectrum, as shown in Table 1.

TABLE 1

| Determined composition | Composition radiation spectrum |
| --- | --- |
| 7.2 weight % C | 7 weight % C |
| 44.8 weight % O | 45 weight % O |
| 14 weight % Si | 14 weight % Si |
| 5.34 weight % S | 5.3 weight % S |
| 24 weight % Ca | 24 weight % Ca |
| 4.7 weight % Fe | 4.7 weight % Fe |

If the determined composition mentioned in Table 1 is the closest to the composition provided by the radiation spectrum of all of the compositions based on the possible combinations, the determined composition mentioned in Table 1 is selected. Accordingly, the considered volume unit 502 comprises 30% quartz, 60% calcite and 10% pyrite.

In a further embodiment of the method according to the system described herein, the step of segmenting is carried out for each remaining volume unit 502 of the region 805.

The method according to the system described herein makes it possible that a petrologist may accurately determine the mineralogy of a rock. It combines the high resolution of an image provided by a charged particle beam device with information provided by radiation analysis, for example EDX.

Various embodiments discussed herein may be combined with each other in appropriate combinations in connection with the system described herein. Additionally, in some instances, the order of steps in the flow diagrams, flowcharts and/or described flow processing may be modified, where appropriate. Further, various aspects of the system described herein may be implemented using software, hardware, a combination of software and hardware and/or other computer-implemented modules or devices having the described features and performing the described functions. The system may further include a display and/or other computer components for providing a suitable interface with a user and/or with other computers.

Software implementations of aspects of the system described herein may include executable code that is stored in a computer-readable medium and executed by one or more processors. The computer-readable medium may include volatile memory and/or non-volatile memory, and may include, for example, a computer hard drive, ROM, RAM, flash memory, portable computer storage media such as a CD-ROM, a DVD-ROM, an SO card, a flash drive or other drive with, for example, a universal serial bus (USB) interface, and/or any other appropriate tangible or non-transitory computer-readable medium or computer memory on which executable code may be stored and executed by a processor. The system described herein may be used in connection with any appropriate operating system.

Other embodiments of the invention will be apparent to those skilled in the art from a consideration of the specification and/or an attempt to put into practice the invention disclosed herein. It is intended that the specification and examples be considered as exemplary only, with the true scope and spirit of the invention being indicated by the following claims.

The invention claimed is:

1. A method for analyzing an object using a charged particle beam device having a charged particle generator for generating a charged particle beam with charged particles, an objective lens for focusing the charged particle beam onto the object, a first detection unit for detecting interaction particles and a second detection unit for detecting interaction radiation, the interaction particles and the interaction radiation being generated when the charged particle beam impinges on the object, and including a database storing information about characteristics of a first particle and of a second particle, the method comprising:
   guiding the charged particle beam over the object;
   detecting interaction particles using the first detection unit;
   generating a first detection signal using the first detection unit;
   generating an image of the object using the first detection signal, the image having regions of different color levels and the image having an image resolution;
   detecting interaction radiation using the second detection unit;
   generating a second detection signal using the second detection unit;
   generating a radiation spectrum using the second detection signal, the radiation spectrum representing a volume unit of the object;
   providing information about an overall material composition of the volume unit, the volume unit having a first extension along a first axis, a second extension along a second axis, and a third extension along a third axis, the image resolution being less than at least one of: the first extension, the second extension and the third extension, and the volume unit having a volume unit surface being spanned by two of: the first axis, the second axis, and the third axis;
   segmenting a part of the image corresponding to the volume unit surface into an area having a first color level and a second color level;
   determining a first area fraction of the area having the first color level and determining a second area fraction of the area having the second color level;
   identifying the first particle associated with the first color level by comparing the first color level with the information stored in the database, and identifying the second particle associated with the second color level by comparing the second color level with the information stored in the database; and
   determining a composition of the volume unit by using characteristics of the first particle, the first area fraction, characteristics of the second particle and the second area fraction, wherein the composition of the volume unit is proportionally composed of the first particle in a quantity of the first area fraction and of the second particle in a quantity of the second area fraction.

2. The method according to claim 1, wherein at least one of: the first color level and the second color level is a gray level.

3. The method according to claim 1, wherein at least one of: the first particle and the second particle is a mineral.

4. The method according to claim 1, wherein the database also stores information about characteristics of a third particle, and the area also includes a third color level, the method further comprising:
   determining a third area fraction of the area having the third color level;
   identifying the third particle associated with the third color level by comparing the third color level with the information stored in the database; and
   determining the composition of the volume unit also by using the third particle and the third area fraction, wherein the composition of the volume unit is also proportionally composed of the third particle in a quantity of the third area fraction.

5. The method according to claim 4, wherein the area includes the first color level, the second color level and the third color level only.

6. The method according to claim 4, wherein the third color level is a gray level.

7. The method according to claim 1, wherein the database includes information about characteristics of a plurality of first particles and about characteristics of a plurality of second particles and wherein identifying the first particle includes identifying a part or all of the plurality of first particles associated with the first color level and determining a single first particle out of the part or all of the plurality of first particles, wherein the characteristics of the single first particle come closest to the information about the overall material composition of the volume unit with respect to all of the plurality of first particles and wherein determining the composition of the volume unit uses the single first particle.

8. The method according to claim 1, wherein the database includes information about characteristics of a plurality of first particles and about characteristics of a plurality of second particles and wherein identifying the second particle includes identifying a part or all of the plurality of second particles associated with the second color level and determining a single second particle out of the part or all of the plurality of second particles, wherein the characteristics of the second particle come closest to the information about the overall material composition with respect to all of the plurality of second particles and wherein determining the composition of the volume unit uses the single second particle.

9. The method according to claim 1, wherein segmenting the part of the image includes using a gray level histogram.

10. The method, according to claim 1, further comprising at least one of:
    if the first particle is larger than the volume unit, the first particle is identified by using the radiation spectrum;
    if the second particle is larger than the volume unit, the second particle is identified by using the radiation spectrum;
    if the volume unit includes organic material, the organic material is assigned a given chemical composition; and
    if the volume unit includes organic material, the organic material is assigned a given chemical composition of 95 weight % carbon and 5 weight % oxygen.

11. The method according to claim 1, wherein the interaction particles are at least one of: secondary particles, secondary electrons, backscattered particles, and backscattered electrons.

12. The method according to claim 1, wherein the interaction radiation is at least one of: X-ray-radiation and cathodoluminescence light.

13. The method according to claim 1, further comprising:
    using a calibration object to calibrate at least one of: the first detection unit and the second detection unit.

14. A method for analyzing an object using a charged particle beam device with a charged particle generator for generating a charged particle beam having charged particles, an objective lens for focusing the charged particle beam onto the object, a first detection unit for detecting interaction particles and a second detection unit for detecting interaction radiation, the interaction particles and the interaction radiation being generated when the charged particle beam impinges on the object, and including a database storing information about characteristics of a plurality of particles, the method comprising:

guiding the charged particle beam over the object;

detecting interaction particles using the first detection unit, generating a first detection signal using the first detection unit and generating an image of the object using the first detection signal, the image having regions of different color levels and the image having an image resolution;

detecting interaction radiation using the second detection unit, generating a second detection signal using the second detection unit and generating a radiation spectrum using the second detection signal, the radiation spectrum representing a volume unit of the object and providing information about the overall material composition of the volume unit, the volume unit having a first extension along a first axis, a second extension along a second axis and a third extension along a third axis, the image resolution being less than at least one of: the first extension, the second extension and the third extension, and the volume unit having a volume unit surface being spanned by two of: the first axis, the second axis and the third axis;

segmenting a part of the image corresponding to the volume unit surface in an area having a first color level and a second color level;

determining a first area fraction of the area including the first color level and determining a second area fraction of the area including the second color level;

identifying a first part of the plurality of particles, the first part being associated with the first color level, by comparing the first color level with the information stored in the database, and identifying a second part of the plurality of particles, the second part being associated with the second color level, by comparing the second color level with the information stored in the database;

determining possible compositions of the volume unit for each possible combination of each single particle of the first part of the plurality of particles with each single particle of the second part of the plurality of particles by using characteristics of the single particle of the first part of the plurality of particles, the first area fraction, characteristics of the single particle of the second part of the plurality of particles and the second area fraction, wherein the composition of the volume unit is proportionally composed of the single particle of the first part of the plurality of particles in a quantity of the first area fraction and of the single particle of the second part of the plurality of particles in a quantity of the second area fraction;

comparing each possible composition with the overall material composition of the volume unit provided by the radiation spectrum; and determining the actual composition of the volume unit by choosing the composition out of all possible compositions which comes closest to the overall material composition of the volume unit provided by the radiation spectrum.

15. The method according to claim 14, wherein at least one of: the first color level and the second color level is a gray level.

16. The method according to claim 14, wherein the particles of the plurality of particles are minerals.

17. The method according to claim 14, wherein the area also includes a third color level, the method further comprising:

determining a third area fraction of the area having the third color level;

identifying a third part of the plurality of particles, the third part being associated with the third color level, by comparing the third color level with the information stored in the database, determining possible compositions of the volume unit includes each possible combination with each single particle of the third part of the plurality of particles using characteristics of the single particle of the third part of the plurality of particles and the third area fraction.

18. The method according to claim 17, wherein the area includes the first color level, the second color level and the third color level only.

19. The method according to claim 17, wherein the third color level is a gray level.

20. The method according to claim 14, wherein segmenting the part of the image uses a gray level histogram.

21. The method according claim 14, further comprising at least one of:

if the volume unit includes one particle only and if the one particle is larger than the volume unit, the one particle is identified by using the radiation spectrum;

if the volume unit includes organic material, the organic material is assigned a given chemical composition; and if the volume unit includes organic material, the organic material is assigned a given chemical composition of 95 weight % carbon and 5 weight % oxygen.

22. The method according to claim 14, wherein the interaction particles are at least one of: secondary particles, secondary electrons, backscattered particles, and backscattered electrons.

23. The method according to claim 14, wherein the interaction radiation is at least one of: X-ray-radiation and cathodoluminescence light.

24. The method according to claim 14, further comprising:

using a calibration object to calibrate at least one of: the first detection unit and the second detection unit.

25. Computer program product comprising a program code which is loaded into a processor and, which, when being executed, controls a charged particle beam device to analyze an object by the following steps:

guiding the charged particle beam over the object;

detecting interaction particles using a first detection unit;

generating a first detection signal using the first detection unit;

generating an image of the object using the first detection signal, the image having regions of different color levels and the image having an image resolution;

detecting interaction radiation using a second detection unit;

generating a second detection signal using the second detection unit;

generating a radiation spectrum using the second detection signal, the radiation spectrum representing a volume unit of the object;

providing information about an overall material composition of the volume unit, the volume unit having a first extension along a first axis, a second extension along a second axis, and a third extension along a third axis, the image resolution being less than at least one of: the first extension, the second extension and the third extension, and the volume unit having a volume unit surface being spanned by two of: the first axis, the second axis, and the third axis;

segmenting a part of the image corresponding to the volume unit surface into an area having a first color level and a second color level;

determining a first area fraction of the area having the first color level and determining a second area fraction of the area having the second color level;

identifying a first particle associated with the first color level by comparing the first color level with information stored in a database, and identifying a second particle associated with the second color level by comparing the second color level with the information stored in the database; and determining a composition of the volume unit by using characteristics of the first particle, the first area fraction, characteristics of the second particle and the second area fraction, wherein the composition of the volume unit is proportionally composed of the first particle in a quantity of the first area fraction and of the second particle in a quantity of the second area fraction.

26. A charged particle beam device for analyzing an object, comprising:
 a charged particle generator for generating a charged particle beam having charged particles;
 an objective lens for focusing the charged particle beam onto the object;
 a first detection unit for detecting interaction particles and a second detection unit for detecting interaction radiation, the interaction particles and the interaction radiation being generated when the charged particle beam impinges on the object;
 a database storing information about characteristics of particles; and
 a processor into which a computer program product is loaded to perform the following:
 guiding the charged particle beam over the object;
 detecting interaction particles using the first detection unit;
 generating a first detection signal using the first detection unit;
 generating an image of the object using the first detection signal, the image having regions of different color levels and the image having an image resolution;
 detecting interaction radiation using the second detection unit;
 generating a second detection signal using the second detection unit;
 generating a radiation spectrum using the second detection signal, the radiation spectrum representing a volume unit of the object;

providing information about an overall material composition of the volume unit, the volume unit having a first extension along a first axis, a second extension along a second axis, and a third extension along a third axis, the image resolution being less than at least one of: the first extension, the second extension and the third extension, and the volume unit having a volume unit surface being spanned by two of: the first axis, the second axis, and the third axis;

segmenting a part of the image corresponding to the volume unit surface into an area having a first color level and a second color level;

determining a first area fraction of the area having the first color level and determining a second area fraction of the area having the second color level;

identifying a first particle associated with the first color level by comparing the first color level with the information stored in the database, and identifying a second particle associated with the second color level by comparing the second color level with the information stored in the database; and determining a composition of the volume unit by using characteristics of the first particle, the first area fraction, characteristics of the second particle and the second area fraction, wherein the composition of the volume unit is proportionally composed of the first particle in a quantity of the first area fraction and of the second particle in a quantity of the second area fraction.

27. The charged particle beam device according to claim 26, further comprising:
 a first detector used for the first detector unit and a second detector used for the second detector unit.

28. The charged particle beam device according to claim 26, further comprising:
 a single detector used for the first detector unit and the second detector unit.

29. The charged particle beam device according to claim 26, wherein the charged particle generator is a first charged particle beam generator for generating a first charged particle beam having first charged particles, wherein the objective lens is a first objective lens for focusing the first charged particle beam onto the object, and wherein the charged particle beam device further includes a second charged particle beam generator for generating a second charged particle beam having second charged particles and a second objective lens for focusing the second charged particle beam onto the object.

30. The charged particle beam device according to claim 26, wherein the charged particle beam device is at least one of the following: an electron beam device and an ion beam device.

* * * * *